(12) United States Patent
Endres et al.

(10) Patent No.: US 8,395,754 B2
(45) Date of Patent: Mar. 12, 2013

(54) ILLUMINATION OPTICAL UNIT FOR EUV MICROLITHOGRAPHY

(75) Inventors: Martin Endres, Koenigsbronn (DE); Sebastian Doern, Oberkochen (DE); Stig Bieling, Aalen (DE); Marc Kirch, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 357 days.

(21) Appl. No.: 12/949,478

(22) Filed: Nov. 18, 2010

(65) Prior Publication Data

US 2011/0141445 A1 Jun. 16, 2011

(30) Foreign Application Priority Data

Dec. 11, 2009 (DE) .................. 10 2009 054 540

(51) Int. Cl.
*G03B 27/54* (2006.01)
*G03B 27/68* (2006.01)
*G03B 27/52* (2006.01)
(52) U.S. Cl. ................. 355/67; 355/52; 355/55; 355/70
(58) Field of Classification Search .................. 355/52, 355/53, 55, 67–71, 77; 359/627; 250/492.1, 250/492.2, 492.22, 493.1, 548
See application file for complete search history.

(56) References Cited

U.S. PATENT DOCUMENTS

| | | | | |
|---|---|---|---|---|
| 6,658,084 B2 * | 12/2003 | Singer | .............................. | 378/34 |
| 2003/0227606 A1 * | 12/2003 | Sweatt | ............................ | 355/53 |
| 2004/0108467 A1 * | 6/2004 | Eurlings et al. | ............. | 250/492.1 |
| 2004/0130561 A1 * | 7/2004 | Jain | ............................... | 345/694 |

(Continued)

FOREIGN PATENT DOCUMENTS

| | | |
|---|---|---|
| DE | 100 53 587 | 5/2000 |
| DE | 10 2006 020 734 | 11/2007 |
| DE | 10 2008 009 600 | 8/2009 |

OTHER PUBLICATIONS

English translation of German Examination report for corresponding Application No. DE 10 2009 054 540.9, dated Jul. 26, 2010.

(Continued)

*Primary Examiner* — Toan Ton
*Assistant Examiner* — Christina Riddle

(74) *Attorney, Agent, or Firm* — Fish & Richardson P.C.

(57) ABSTRACT

An illumination optical unit for EUV microlithography includes a first optical element having a plurality of first reflective facet elements and a second optical element having a plurality of second reflective facet elements. Each first reflective facet element from the plurality of the first reflective facet elements has a respective maximum number of different positions which defines a set—associated with the first facet element—consisting of second reflective facet elements in that the set consists of all second facet elements onto which the first facet element directs radiation in its different positions during the operation of the illumination optical unit. The plurality of second reflective facet element forms a plurality of disjoint groups, wherein each of the groups and each of the sets contain at least two second facet elements, and there are no two second facet elements of a set which belong to the same group. This construction makes it possible to provide an illumination optical unit which can be used to provide a large number of different angle-dependent intensity distributions at the location of the object field.

20 Claims, 16 Drawing Sheets

U.S. PATENT DOCUMENTS

2004/0227922 A1* 11/2004 Dierichs et al. ............. 355/71
2005/0174650 A1* 8/2005 Melzer et al. ............. 359/627
2007/0165202 A1* 7/2007 Koehler et al. ............. 355/67
2009/0041182 A1* 2/2009 Endres et al. ............. 378/34
2009/0079952 A1 3/2009 Mann

OTHER PUBLICATIONS

European Office Action for corresponding EP Application No. 10191631.0, dated Apr. 26, 2011.

* cited by examiner

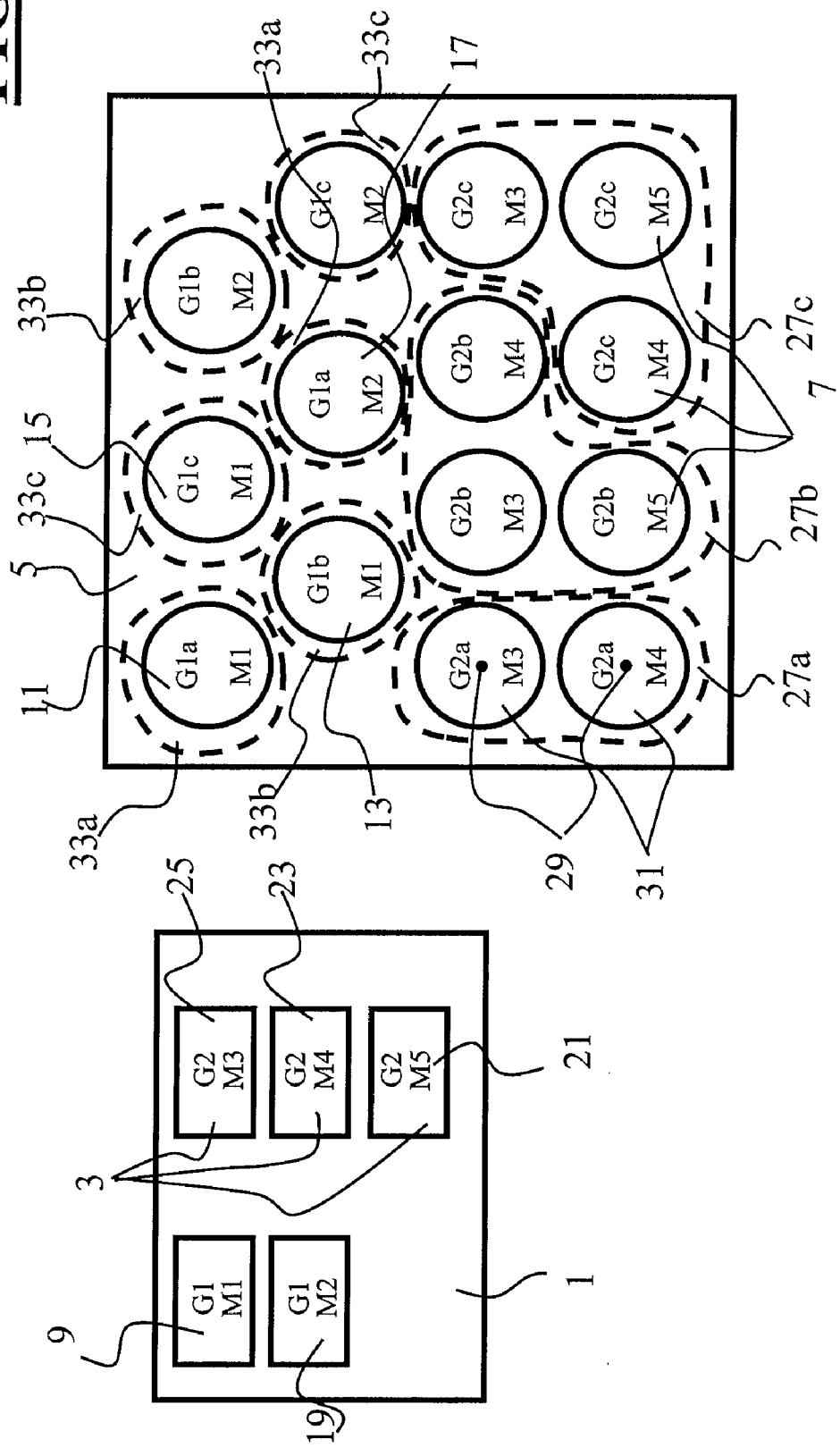

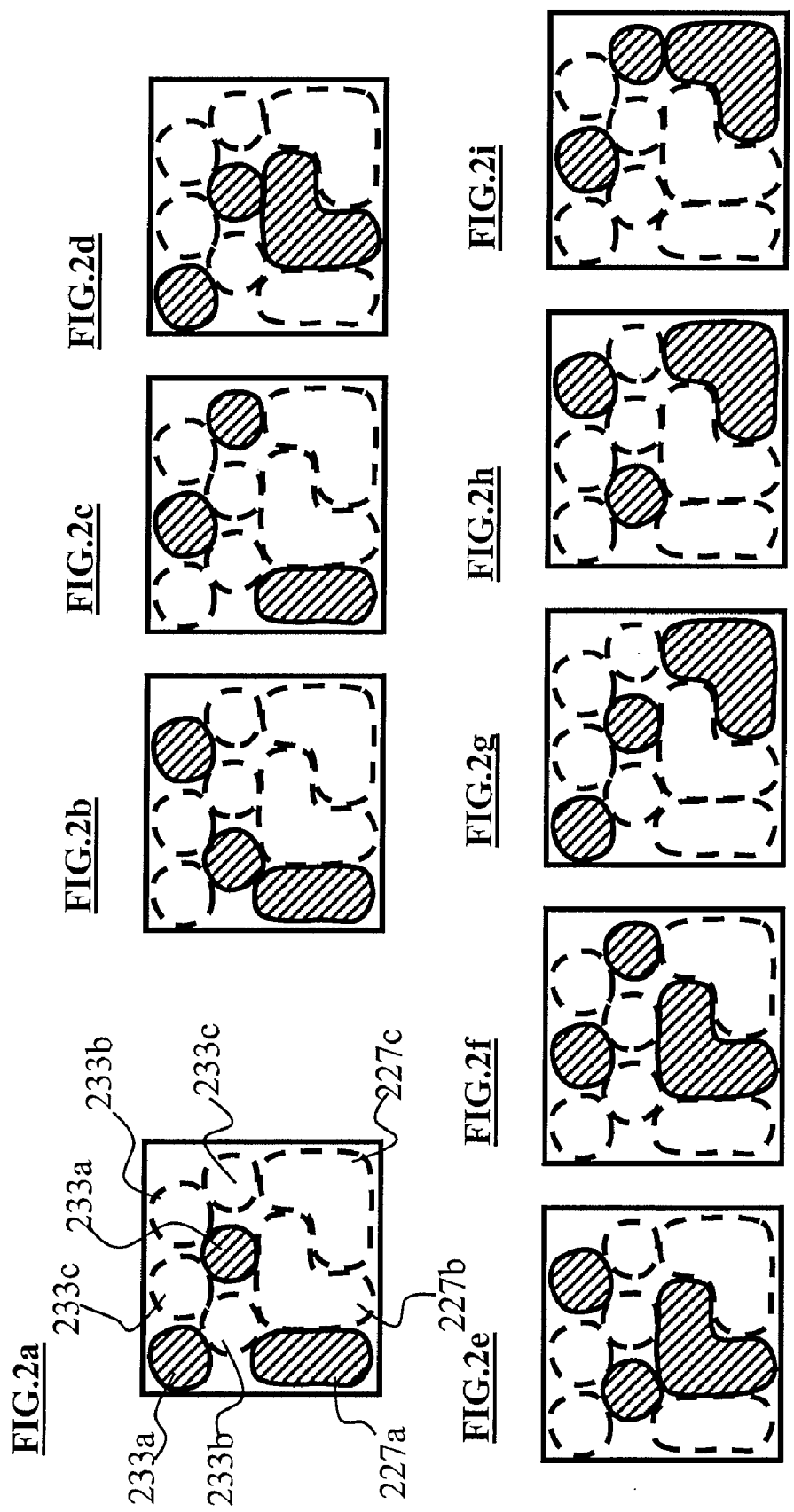

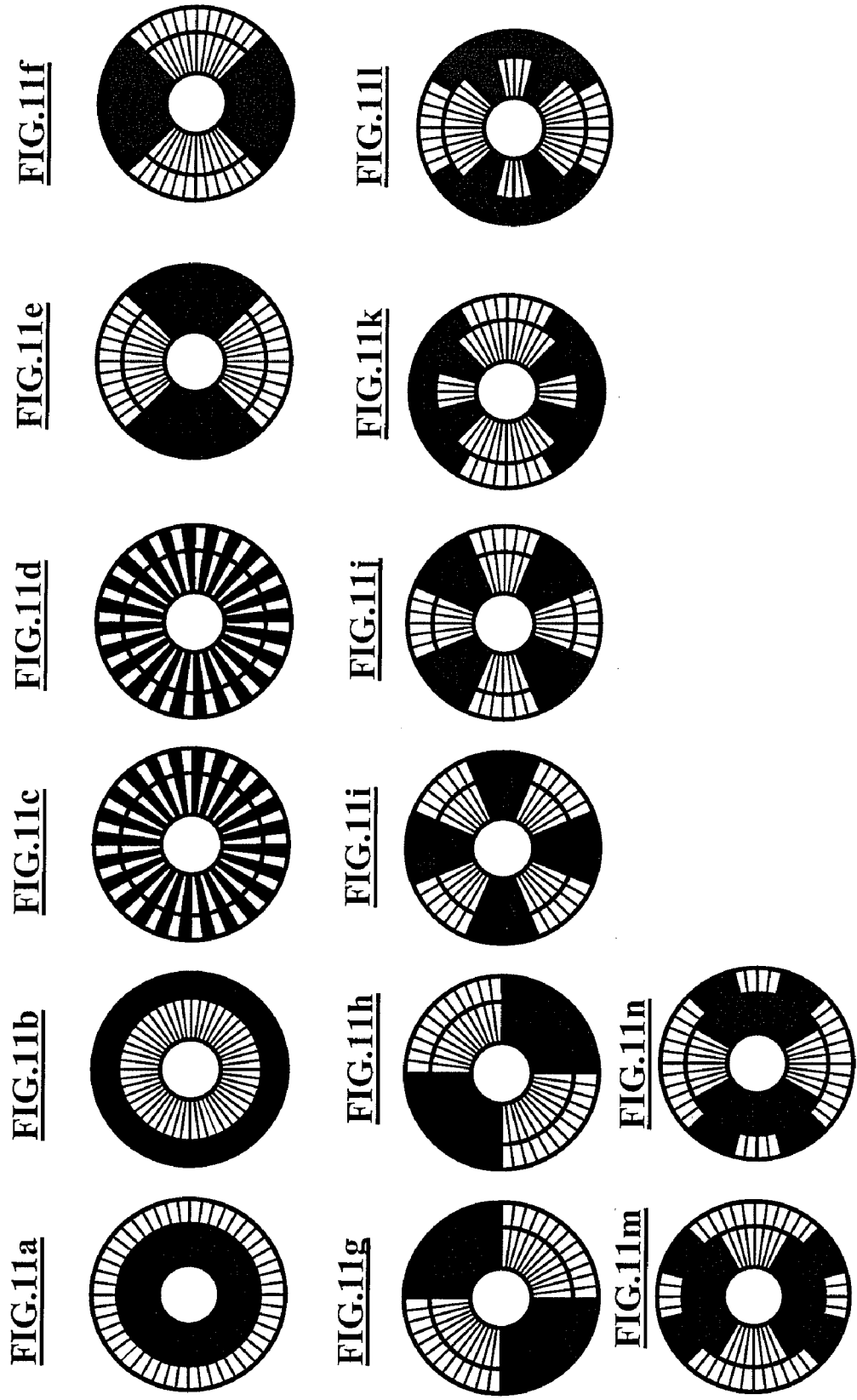

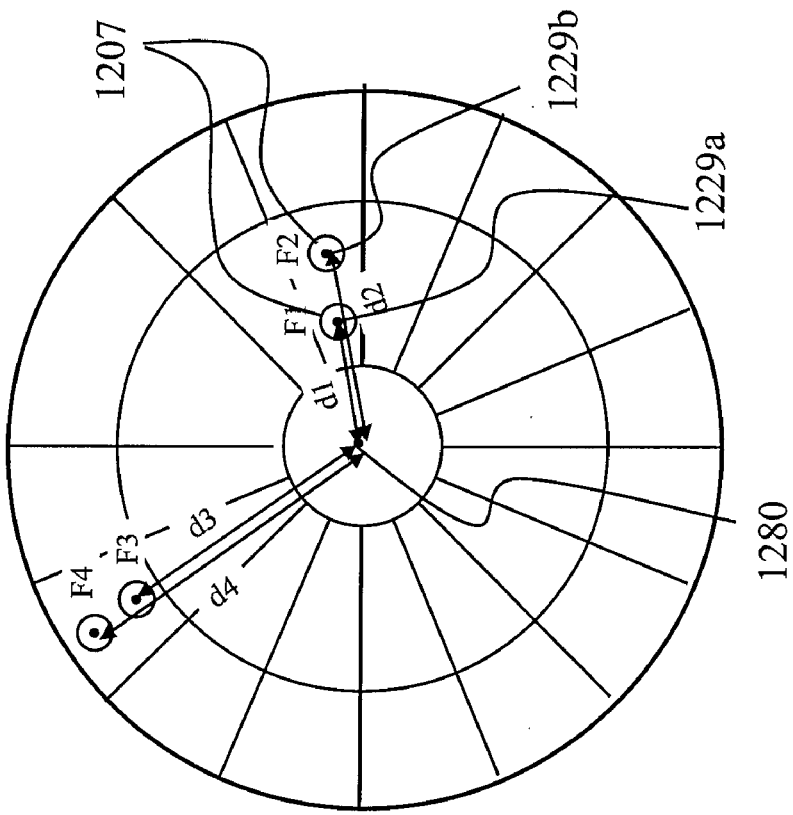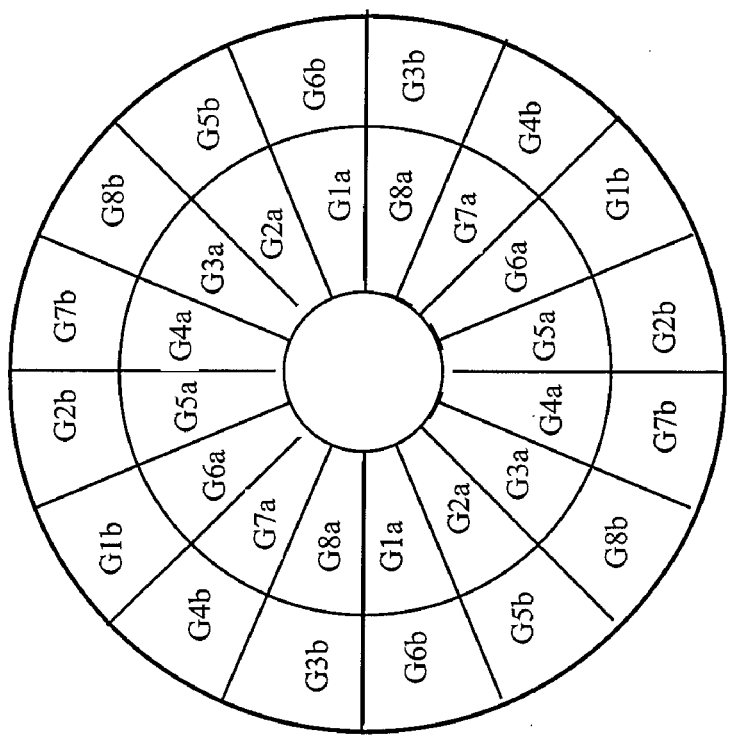

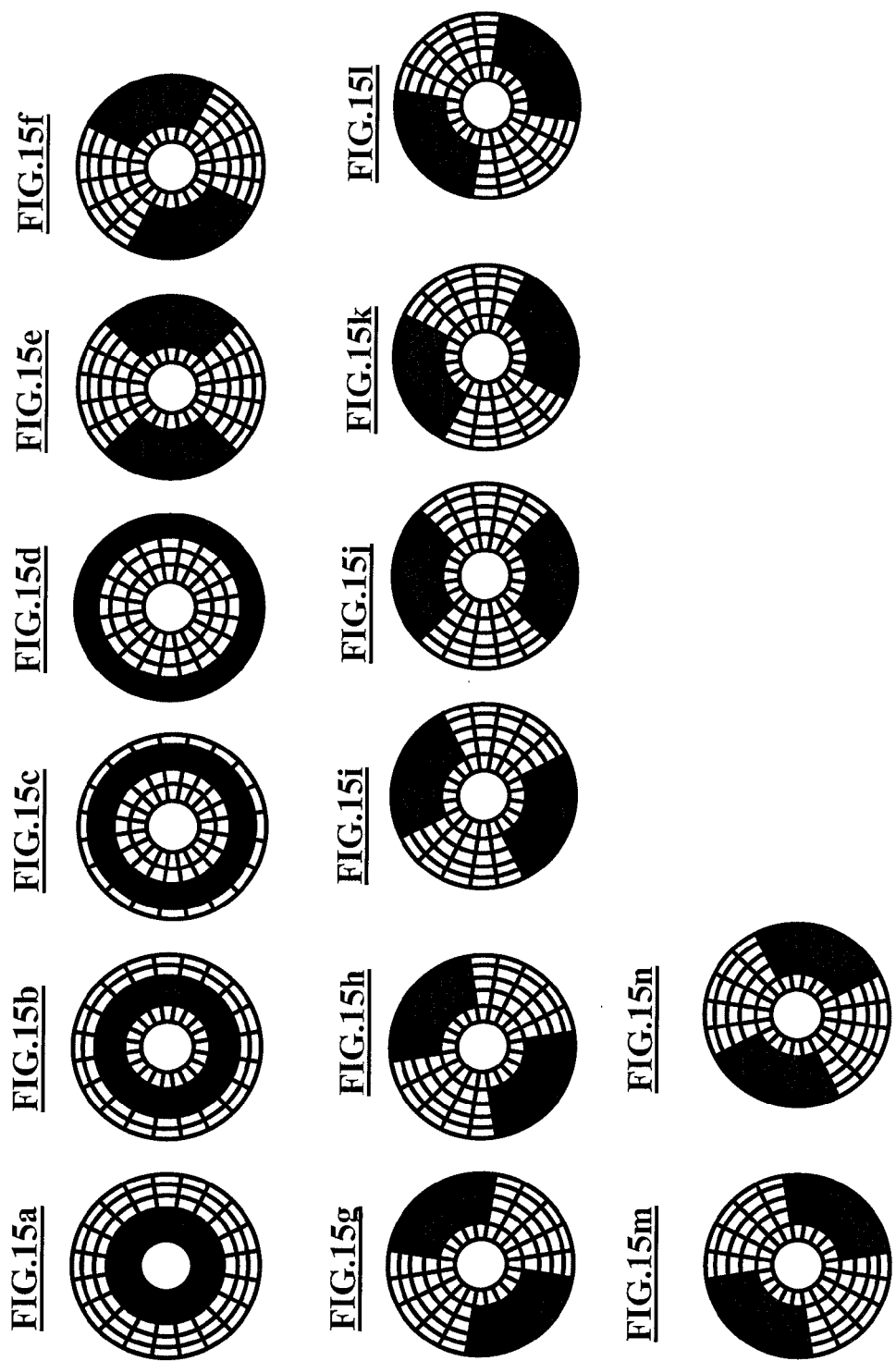

ILLUMINATION OPTICAL UNIT FOR EUV MICROLITHOGRAPHY

CROSS-REFERENCE RELATED APPLICATIONS

This application claims priority under 35 U.S.C. §119 to German Application No. 10 2009 054 540.9, filed Dec. 11, 2009. The contents of this application are hereby incorporated by reference in its entirety.

FIELD

The disclosure relates to an illumination optical unit for EUV microlithography including a first optical element having a plurality of first reflective facet elements and a second optical element having a plurality of second reflective facet elements. The disclosure also relates to a microlithography projection exposure apparatus including an illumination optical unit of this type.

BACKGROUND

Microlithography projection exposure apparatuses are commonly used to produce microstructured components via a photolithographic method. In such a method, a structure-bearing mask, the so-called reticle, is illuminated with the aid of a light source unit and an illumination optical unit and is imaged onto a photosensitive layer with the aid of a projection optical unit. The light source unit provides a radiation which is directed into the illumination optical unit. The illumination optical unit serves for making available at the location of the structure-bearing mask a uniform illumination with a predetermined angle-dependent intensity distribution. For this purpose, various suitable optical elements are provided within the illumination optical unit. The structure-bearing mask illuminated in this way is imaged onto a photosensitive layer with the aid of the projection optical unit. The minimum feature size which can be imaged with the aid of such a projection optical unit is determined, inter alia, by the wavelength of the radiation used. The smaller the wavelength of the radiation, the smaller the structures which can be imaged with the aid of the projection optical unit. Primarily imaging radiation having a wavelength in the region of 365 nm, 248 nm, 193 nm or imaging radiation in the extreme ultraviolet (EUV) range, i.e. in the range of 5 nm to 15 nm, is used in this case. When radiation having a wavelength in the region of 193 nm is used, both refractive optical elements and reflective optical elements are used within the illumination optical unit and the projection optical unit. By contrast, when imaging radiation having a wavelength in the range of 5 nm to 15 nm is used, exclusively reflective optical elements (mirrors) are generally used. A further possibility for reducing the minimum feature size which can be imaged with the aid of such a projection optical unit relates to the angle-dependent intensity distribution of the illumination at the object field being coordinated with the structure-bearing mask.

SUMMARY

The disclosure provides an illumination optical unit which can be used to provide a large number of different angle-dependent intensity distributions at the location of the object field.

The disclosure provides an illumination optical unit for EUV microlithography including a first optical element having a plurality of first reflective facet elements and a second optical element having a plurality of second reflective facet elements. Each first reflective facet element from the plurality of the first reflective facet elements has a respective maximum number of different positions which defines a set—associated with the first facet element—consisting of second reflective facet elements in that the set consists of all second facet elements onto which the first facet element directs radiation in its different positions during the operation of the illumination optical unit. The plurality of second reflective facet element forms a plurality of disjoint groups, wherein each of the groups and each of the sets contain at least two second facet elements, and there are no two second facet elements of a set which belong to the same group.

A plurality of groups of facet elements is termed disjoint if there is no facet element which belongs to two groups simultaneously.

These groups can additionally be characterized by whether they are inverse with respect to one another. A number of disjoint groups G1, ..., GN composed of second reflective facet elements are termed inverse with respect to one another if each second reflective facet element from one of the groups G1, ..., GN belongs to a set and this set contains only second reflective facet elements from the groups G1, ..., GN. This means, inter alia, that although the first optical element can assume one state in which radiation is directed onto all second reflective facet elements of one of the groups G1, ..., GN during operation of the illumination optical unit and another state in which radiation is directed onto all second reflective facet elements of another group G1, ..., GN, the first optical element cannot assume a state in which radiation is directed onto all second reflective facet elements from one of the groups G1, ..., GN and at least one second reflective facet element of another group. This arises since radiation cannot simultaneously be directed onto two second reflective facet elements which belong to the same set.

In some embodiments of the illumination optical unit, there are at least one first and one second group of second reflective facet elements such that for each second reflective facet element of the first group there is a second reflective facet element of the second group, which belong to the same set, and the first and second groups contain the same number of second reflective facet elements. These two properties have the effect that also for each second reflective facet element of the second group there is a second reflective facet element of the first group, which belong to the same set. The first reflective facet elements can therefore assume at least a first position, in which radiation is directed onto all second reflective facet elements of the first group during the operation of the illumination optical unit, and a second position, in which radiation is directed onto all second reflective facet elements of the second group during the operation of the illumination optical unit.

In some embodiments of the illumination optical unit, each first reflective facet element of the plurality of the first reflective facet elements has a reflective optical surface having a normal vector, wherein the positions of the first reflective facet elements differ in the orientation of the normal vector. This configuration allows a simple realization of the disclosure by virtue of the reflective optical surfaces of the first reflective facet elements being embodied in tiltable fashion.

In a further configuration of the disclosure, for each second reflective facet element there is exactly one assigned first reflective facet element, which has a first position such that the associated first reflective facet element directs radiation onto the second reflective facet element in the position during the operation of the illumination optical unit. Accordingly, radiation that is directed onto the second reflective facet element is always radiation that comes from the same direction, namely from the direction of the exactly one assigned first facet element. A reflective optical surface of the second optical element can therefore always be oriented identically, wherein the orientation is chosen such that the radiation is forwarded in the direction of the object field. Therefore, it is not necessary to configure the reflective optical surface of the second reflective optical element in tiltable fashion, which allows a simpler mechanical construction.

In one development of this embodiment of the illumination optical unit, each group of second reflective facet elements defines an assigned group of first reflective facet elements in that the assigned group of first reflective facet elements contains all first reflective facet elements which are assigned to the second reflective facet elements of the group of second reflective facet elements, and wherein all first reflective facet elements of the same assigned group are embodied in such a way that a change between two positions can only be effected jointly. This can be realized, for example, by the fact that the first reflective facet elements of a group are mechanically connected to one another, such that the change in the position can only be effected jointly, or else by the fact that all first reflective facet elements of a group can only be driven jointly because this is provided as such in control electronics. This has the advantage that the mechanical embodiment or the electronic control can be embodied more simply since, for example, one control signal can be used to alter the position of all first reflective facets of a group. At the same time, the group classification according to the disclosure still makes it possible to provide a large number of different angle-dependent intensity distributions at the location of the object field.

In addition, an illumination optical unit of this type can be developed in such a way that the normal vectors of two first reflective facet elements of the same assigned group have different directions in at least one common position. This has the advantage that the first reflective facet elements of the same assigned group can be arranged in a manner distributed over the entire first optical element, even if the second reflective facet elements are substantially adjacent to one another. This makes it possible to adapt the arrangement of the first reflective facet elements to the illumination of the first optical element by the light source unit.

In some embodiments of the illumination optical unit, all sets contain exactly two second reflective facet elements. This means that each first reflective facet element of at least one portion of the first reflective facet elements has exactly two positions. A first position, in which it directs radiation onto one of the second reflective facet elements during the operation of the illumination optical unit, and a second position, in which it directs radiation onto another second reflective facet element. Such an embodiment of the first reflective facet elements can be realized in a mechanically simple manner by the use of two precise end stops for only one rotation axis.

In an alternative configuration of the illumination optical unit, there is at least one set having exactly two second reflective facet elements and there is at least one set having more than two second reflective facet elements. As a result, the flexibility is increased and it is possible to provide larger numbers of different angle-dependent intensity distributions at the location of the object field.

In some embodiments of the illumination optical unit, the second optical element is arranged in an exit pupil plane of the illumination optical unit or is imaged into an exit pupil plane of the illumination optical unit. Together with the property that the second reflective facet elements have a reflective optical surface having a midpoint, this has the effect that the exit pupil plane is subdivided into disjoint regions such that for each group there is a group-associated region, wherein the midpoints of the reflective optical surfaces of all second reflective facet elements of the group lie in the associated region or are imaged into the associated region. This has the advantage that the group classification arises in a simple manner from the desired illumination distributions in the exit pupil plane.

Although the angle-dependent intensity distribution at the location of the object field is important for the imaging resolution, the distribution is related in a simple manner to the intensity distribution in the exit pupil plane, that is to say to the illumination in the exit pupil plane. Therefore, it is expedient firstly to determine a desired intensity distribution in the exit pupil plane. If the second optical element is then arranged in an exit pupil plane of the illumination optical unit or imaged into the latter, then it is possible to determine in a simple manner onto which of the second reflective facet elements radiation has to be directed in order to achieve such a desired intensity distribution.

In one configuration of the illumination optical unit, all group-associated regions are subdivided into at least two disjoint partial regions, wherein the partial regions are situated centrosymmetrically with respect to a point of symmetry and wherein all regions have the same point of symmetry. This has the advantage that a centrosymmetric illumination automatically arises in the exit pupil plane as soon as radiation is directed onto complete groups of second reflective facet elements during the operation of the illumination optical unit. Whenever radiation is directed onto one second reflective facet element, radiation also has to be directed onto all other second reflective facet elements which belong to the same group. Whenever these conditions are met, a centrosymmetric illumination automatically arises in the exit pupil plane.

In a further embodiment of the disclosure, for each pair of second reflective facet elements F1 and F2 having the following properties that
a. the second reflective facet elements F1 and F2 belong to the same group,
b. the midpoint of the reflective optical surface of the second reflective facet element F1 or the image of the midpoint of the reflective optical surface of the second reflective facet element F1 in the exit pupil plane is at a distance d1 from the point of symmetry,
c. the midpoint of the reflective optical surface of the second reflective facet element F2 or the image of the midpoint of the reflective optical surface of the second reflective facet element F2 in the exit pupil plane is at a distance d2 from the point of symmetry,
d. and the distance d2 is greater than the distance d1,
there is an assigned pair of second reflective facet elements F3 and F4 having the properties that
e. the second reflective facet elements F3 and F4 belong to the same group,
f. the second reflective facet elements F1 and F3 belong to the same set,
g. the second reflective facet elements F2 and F4 belong to the same set,
h. the midpoint of the reflective optical surface of the second reflective facet element F3 or the image of the midpoint of the reflective optical surface of the second reflective facet element F3 in the exit pupil plane is at a distance d3 from the point of symmetry,
i. the midpoint of the reflective optical surface of the second reflective facet element F4 or the image of the midpoint of the reflective optical surface of the second reflective facet element F4 in the exit pupil plane is at a distance d4 from the point of symmetry,
j. and the distance d4 is greater than the distance d3.

What is achieved as a result is that the spatial extent of the illumination in the exit pupil plane can be set particularly flexibly with the aid of the illumination optical unit according to the disclosure.

In addition, the illumination optical unit can be developed in such a way that all partial regions have the form of a segment of an annulus. This enables a multiplicity of different illuminations in the exit pupil plane, which are not just centrosymmetric but have further symmetries. Exactly the form of a segment of an annulus makes it possible to provide illuminations which have mirror symmetries with respect to axes, although the axes have to run through the point of symmetry. In this case, the segments of annuli are segments of annuli whose midpoint is the point of symmetry.

In some embodiments of the illumination optical unit, the union of all group-associated regions has the form of a complete circle or complete annulus. This has the advantage that all illuminations which can be set in the exit pupil plane lie within the annulus.

In a further configuration of the disclosure, there is a plurality of groups of second facet elements forming a class, wherein the union of all group-associated regions which belong to the groups of the class has the form of a complete annulus, and wherein there are no two second facet elements from the same class which belong to the same set. What is achieved as a result is that the first reflective facet elements have positions such that radiation is directed onto all facet elements of a class during the operation of the illumination optical unit.

In a further embodiment of the disclosure, there is a plurality of groups forming a class, wherein the union of all group-associated regions which belong to the groups of the class has the form of a dipole, and wherein there are no two second facet elements from the same class which belong to the same set. In this way, it is possible to produce a dipole-type illumination in the exit pupil plane by radiation being directed onto all second reflective facet elements from the class. A dipole is understood to mean a form which consists of exactly two non-contiguous regions, wherein the connecting line of the midpoints of the two regions defines the main dipole axis. In this case, the two non-contiguous regions are centrosymmetric with respect to one another with a point of symmetry lying on the main dipole axis. Illuminations of this type allow a high-resolution imaging of structures extending substantially in one direction. In this case, the dipole axis should be set such that it is substantially perpendicular to the direction of the structures.

In a further embodiment of the illumination optical unit, there is a plurality of groups forming a class, wherein the union of all group-associated regions which belong to the groups of the class has the form of a quadrupole, and wherein there are no two second facet elements from the same class which belong to the same set. In this way, it is possible to produce a quadrupole-type illumination in the exit pupil plane by directing radiation onto all second reflective facet elements from the class. A quadrupole is understood to mean a form which is composed two disjoint dipoles, wherein the points of symmetry of the two dipoles coincide. In this case, the main dipole axes each define a main axis of the quadrupole. Quadrupole-type illuminations allow a high-resolution imaging of structures extending substantially in two perpendicular directions. In this case, the two main axes should coincide with the two directions of the structures.

In a further embodiment of the illumination optical unit, there is a plurality of groups forming a class, wherein the union of all group-associated regions which belong to the groups of the class has the form of a hexapole, and wherein there are no two second facet elements from the same class which belong to the same set. In this way, it is possible to produce a hexapole-type illumination in the exit pupil plane by directing radiation onto all second reflective facet elements from the class. A hexapole is understood to mean a form which is composed of three disjoint dipoles, wherein the points of symmetry of the three dipoles coincide. In this case, the main dipole axes each define one of the three main axes of the hexapole. The illumination is often such that the hexapole axes form an angle of 60° in pairs with one another. Hexapole-type illumination allows a good imaging of structures which do not just extend in two perpendicular directions, but additionally have obliquely running portions as well.

The illumination system according to the disclosure typically has a number of second reflective facet elements which is greater than 250, and a number of groups of second reflective facet elements which is less than 50. It has been found that both a uniform illumination of the object field and a flexible setting of the illumination in the exit pupil plane are achieved with these numbers.

In one developed form of the illumination optical unit, the first optical element can assume at least a first state and a second state, which lead to two different illuminations in the exit pupil plane during the operation of the illumination optical unit, wherein radiation is applied to all second reflective facet elements of a first class in the first state, and to all second reflective facet elements of a second class in the second state. In this case, the two states differ in the positions of the first reflective facet elements. Consequently, the state of the first optical element can be altered during the operation of the illumination optical unit, such that the illumination in the exit pupil plane changes from a first illumination to a second illumination. It is thus possible to adapt the illumination during operation to the structure-bearing mask to be imaged.

A microlithography projection exposure apparatus including an illumination optical unit described above has the advantages which have been explained with regard to the illumination optical unit.

BRIEF DESCRIPTION OF THE DRAWINGS

The disclosure will be explained in greater detail with reference to the drawings.

FIG. 1 shows, in two subfigures, extremely schematically an embodiment of a first optical element and of a second optical element.

FIGS. 2a to 2i show the regions into which radiation is directed depending on the state of the first optical element according to FIG. 1.

FIG. 6b shows the second optical element associated with FIG. 6a.

FIGS. 11a to 11n show a selection of illumination patterns which arise on account of the group classification according to FIG. 10.

FIG. 12a shows a further group classification illustration similar to FIG. 10.

FIG. 12b shows schematically how the group classification from FIG. 12a can be improved.

FIGS. 15a to 15n show a selection of illumination patterns which arise on account of the group classification according to FIG. 14.

DETAILED DESCRIPTION

Figure 3A:
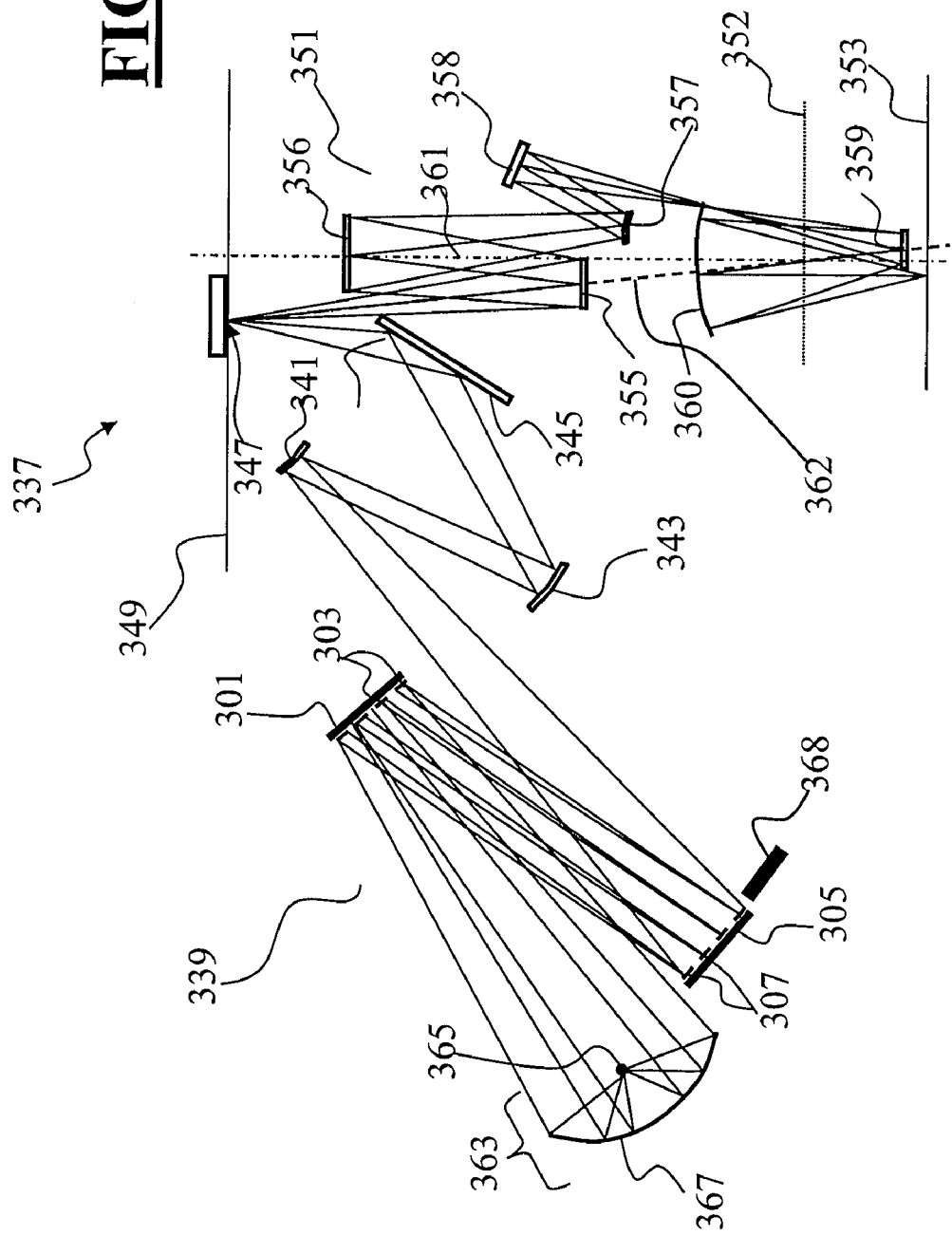
FIG. 3a shows a projection exposure apparatus according to the disclosure including an illumination optical unit.

The reference signs have been chosen such that objects illustrated in FIG. 1 have been provided with one-digit or two-digit numbers. The objects illustrated in the further figures have reference signs having three or more digits, where the last two digits indicate the object and the preceding digit indicates the number of the figure in which the object is illustrated. Therefore, the reference numerals of identical objects that are illustrated in a plurality of figures correspond in terms of the last two digits. If appropriate here the description of these objects may be found in the text concerning a previous figure.

FIG. 1 shows a schematic illustration of the disclosure. The illustration shows a first optical element 1 having a plurality of first reflective facet elements 3 and a second optical element 5 having a plurality of second reflective facet elements 7. In this case, the plurality of second reflective facet elements 7 forms a plurality of disjoint groups G1a, G1b, G1c, G2a, G2b and G2c. FIG. 1 indicates, for each of the 14 second reflective facet elements 7 illustrated, to which of the six different groups it belongs. A plurality of groups is termed disjoint if there is no second reflective facet element 7 which belongs to two groups simultaneously. Accordingly, the indication in FIG. 1 concerning the group to which each of the second reflective facet elements 7 belongs is unambiguous. Alongside the classification in groups, the second reflective facet elements 7 form disjoint sets. In this case, the sets are defined with the aid of the first reflective facet elements 3 of the first optical element 1. The five first reflective facet elements 3 illustrated are labeled with M1 to M5 throughout. Each first reflective facet element 3 has a maximum number of different positions. Depending on the position, the first reflective facet element 3 directs radiation onto one of the second reflective facet elements 7. Accordingly, for each first reflective facet element 3 there is an associated set consisting of second reflective facet elements 7 onto which the first reflective facet element 3 directs radiation in at least one position during operation of the illumination optical unit. Conversely, for each second reflective facet element 7 there is exactly one assigned first reflective facet element 3 having a position such that the assigned first reflective facet element directs radiation onto the second reflective facet element 7 in the position during the operation of the illumination optical unit. This is tantamount to the fact that there is no second reflective facet element 7 which belongs to two different sets. Accordingly, the sets are likewise disjoint. FIG. 1 furthermore indicates to which set each of the second reflective facet elements 7 belongs. For this purpose, the second reflective facet elements 7 are also labeled with M1 to M5.

The first reflective facet element 9, labeled with M1, has at least three positions. In the first position, it directs radiation onto the second reflective facet element 11 during the operation of the illumination optical unit; in the second position, it directs radiation onto the second reflective facet element 13 during the operation of the illumination optical unit; and in the third position, it directs radiation onto the second reflective facet element 15 during the operation of the illumination optical unit. Depending on the specific embodiment, the first reflective facet element 9 can also have one or a plurality of further positions in which, during the operation of the illumination optical unit, it directs radiation onto none of the second reflective facet elements 7, but instead e.g. directs radiation onto a diaphragm. The second reflective facet elements 11, 13 and 15 thus belong to the same set, which is identified by M1. However, all three second reflective facet elements 11, 13 and 15 belong to different groups. The second reflective facet element 11 belongs to the group G1a, the second reflective facet element 13 belongs to the group G1b and the second reflective facet element 15 belongs to the group G1c.

Consequently, there are no two elements of this set which belong to the same group. The classification of the second reflective facet elements 7 into the groups G1a to G2c likewise results in a classification of the first reflective facet elements 3 in groups. The group of the first reflective facet elements 3 which is assigned to the group G1a of the second reflective facet elements 7 is obtained by determining the assigned first reflective facet element 3 for each second reflective facet element 7 of the group G1a. The first reflective facet element 9 is assigned to the second reflective facet element 11 since the first reflective facet element 9 has a position such that it directs radiation onto the second reflective facet element 11 in the position during the operation of the illumination optical unit. The first reflective facet element 19 is assigned to the second reflective facet element 17 since the first reflective facet element 19 has a position in which it directs radiation onto the second reflective facet element 17 during the operation of the illumination optical unit. Accordingly, a group G1 consisting of the first reflective facet elements 9 and 19 is assigned to the group G1a consisting of the second reflective facet elements 11 and 17. If this assignment is repeated for the groups G1b and G1c consisting of second reflective facet elements 7, then it is established that the same group G1 consisting of first reflective facet elements 9 and 19 arises. This is owing to the fact that the groups G1a, G1b and G1c each contain second reflective facet elements which belong to the same set (M1 and M2, respectively). It is correspondingly evident that the group G2 consisting of first reflective facet elements 3, is assigned to the group G2b and the group G2c consisting of second reflective facet elements 7. If this procedure is likewise repeated for the group G2a of second reflective facet elements 7, then only a subgroup of the group G2 consisting of first reflective facet elements 3 arises. This is owing to the fact that the first reflective facet element 21 has only two positions in which it directs radiation onto one of the second reflective facet elements 7 during the operation of the illumination optical unit, whereas the first reflective facet elements 23 and 25 have three positions in which they direct radiation onto one of the second reflective facet elements 7 during the operation of the illumination optical unit. To put it another way, the set M5 contains only two second reflective facet elements, whereas the sets M3 and M4 each contain three second reflective facet elements 7. The properties of the sets and groups have the effect that the groups G1a, G1b and G1c of second reflective facet elements 7 are inverse with respect to one another. The same applies to the three groups G2a, G2b and G2c. In this case, a number of disjoint groups G1, . . . , GN composed of second reflective facet elements are termed inverse with respect to one another if each second reflective facet element from one of the groups G1, . . . , GN belongs to a set and the set contains only second reflective facet elements from the groups G1, . . . , GN. This means that although the first optical element 1 can assume one state in which radiation is directed onto all second reflective facet elements 7 of the group G1a and another state in which radiation is directed onto all second reflective facet elements 7 of the group G1b, the optical element cannot assume a state in which radiation is directed onto all second reflective facet elements 7 from the group G1a and at least one second reflective facet element of the group G1b during the operation of the illumination optical unit. As soon as radiation is directed onto all second reflective facet elements 7 from one of the mutually inverse groups, then there is no second reflective facet element from one of the other inverse groups onto which radiation is directed. Here and in all following examples the groups of second reflective facet elements 7 are designed by an upper-case G and a sequential number and also by a letter (a, b, c, . . . ). In this case, groups of second reflective facet elements 7 which correspond in terms of the sequential number and differ only in letters are mutually inverse.

In some embodiments, the second optical element 5 is arranged in an exit pupil plane of the illumination optical unit or is imaged in an exit pupil plane of the illumination optical unit. Corresponding embodiments are described with reference to FIGS. 3a, 3b, 3c and 4. In these exemplary embodiments, the classification of the second reflective facet elements 7 leads to a natural decomposition of the exit pupil plane into disjoint regions. These regions are identified by dashed lines in FIG. 1. In this case, the region associated with a group is defined by the fact that the midpoints of the reflective optical surfaces of all second reflective facet elements of the group lie in the associated region or are imaged into the associated region. In FIG. 1, the region 27a associated with the group G2a arises by virtue of the fact that the midpoints 29 of the optical surfaces 31 lie within the region 27a. Therefore, although the region 27a is not defined unambiguously, it is possible, since the groups are disjoint with respect to one another, always to find an associated region for each group, wherein the midpoints of the reflective optical surfaces of all second reflective facet elements of the group lie in the associated region or are imaged into the associated region, and the regions of all groups are disjoint with respect to one another. If the first optical element 1 is in a first state, in which the first reflective facet elements 21, 23 and 25 assume a first position, in which they direct radiation onto the second reflective facet elements from the group G2a, then radiation is directed into the region 27a of the exit pupil plane.

In one configuration, the first reflective facet elements of at least one group are embodied in such a way that a change between two positions can only be effected jointly. This can be realized for example by virtue of the fact that the first reflective facet elements of a group are mechanically connected to one another, such that the change in position can only be effected jointly, or else by virtue of the fact that all first reflective facet elements of a group can only be driven jointly. If e.g. the group G1 of the two first reflective facet elements 9 and 19 is embodied in this way, then, during the operation of the illumination optical unit, radiation is directed either onto all second reflective facet elements of the group G1a or onto all second reflective facet elements of the group G1b or onto all second reflective facet elements G1c. Consequently, during the operation of the illumination optical unit, radiation is directed either into the region 33a or into the region 33b or into the region 33c, depending on the common position in which the first reflective facet elements 9 and 19 of the group G1 are situated. In the case of a corresponding configuration of the group G2 of first reflective facet elements 3, radiation is directed either into the region 27a or into the region 27b or into the region 27c, depending on the common position of the first reflective facet elements. This is a consequence of the fact that the groups G1a, G1b and G1c are disjoint and mutually inverse. The same applies to the groups G2a, G2b and G2c. Consequently, the first optical element 1 can assume a total of nine states that differ in terms of the common position in which the first reflective facet elements 3 of the group G1 are situated and the common position in which the first reflective facet elements of the group G2 are situated. FIGS. 2a to 2i show the regions into which radiation is directed depending on the state of the first optical element 1. In the first state according to FIG. 2a, the first reflective facet elements of the group G1 are situated in a common position, such that they direct radiation onto the second reflective facet elements of the group G1a. Accordingly, radiation passes into the region 233a. The first reflective facet elements 3 of the group G2 are situated in a common position in the first state, such that they direct radiation onto the second reflective facet elements 7 of the group G2a during the operation of the illumination optical unit. Therefore, radiation is directed into the region 227a. The regions into which radiation is directed are illustrated in a hatched fashion in FIGS. 2a to 2i. Consequently, in the state according to FIG. 2a, radiation is directed into the regions 233a and 227a. Correspondingly, radiation is directed into the regions 233b and 227a in the state according to FIG. 2b, into the regions 233c and 227a in the state according to FIG. 2c, into the regions 233a and 227b in the state according to FIG. 2d, into the regions 233b and 227b in the state according to FIG. 2e, into the regions 233c and 227b in the state according to FIG. 2f, into the regions 233a and 227a in the state according to FIG. 2b, into the regions 233b and 227c in the state according to FIG. 2h, and into the regions 233c and 227c in the state according to FIG. 2i.

FIG. 3a shows a configuration of a projection exposure apparatus 337 according to the disclosure including an illumination optical unit 339. In this case, the illumination optical unit 339 includes a first optical element 301 having a plurality of first reflective facet elements 303 and a second optical element 305 having a plurality of second reflective facet elements 307. A first telescope mirror 341 and a second telescope mirror 343 are arranged in the light path downstream of the second optical element 307, both of the mirrors being operated with normal incidence, that is to say that the radiation impinges on both mirrors at an angle of incidence of between 0° and 45°. In this case, the angle of incidence is understood to be the angle between incident radiation and the normal to the reflective optical surface. Arranged downstream is a deflection mirror 345, which directs the radiation impinging on it onto the object field 347 in the object plane 349. The deflection mirror 345 is operated with grazing incidence, that is to say that the radiation impinges on the mirror at an angle of incidence of between 45° and 90°. A reflective structure-bearing mask is arranged at the location of the object field 349, the mask being imaged into the image plane 353 with the aid of the projection optical unit 351. The projection optical unit 351 includes six mirrors 355, 356, 357, 358, 359 and 360. All six mirrors of the projection optical unit 351 each have a reflective optical surface that runs along a surface that is rotationally symmetrical about the optical axis 361.

Figure 3B:
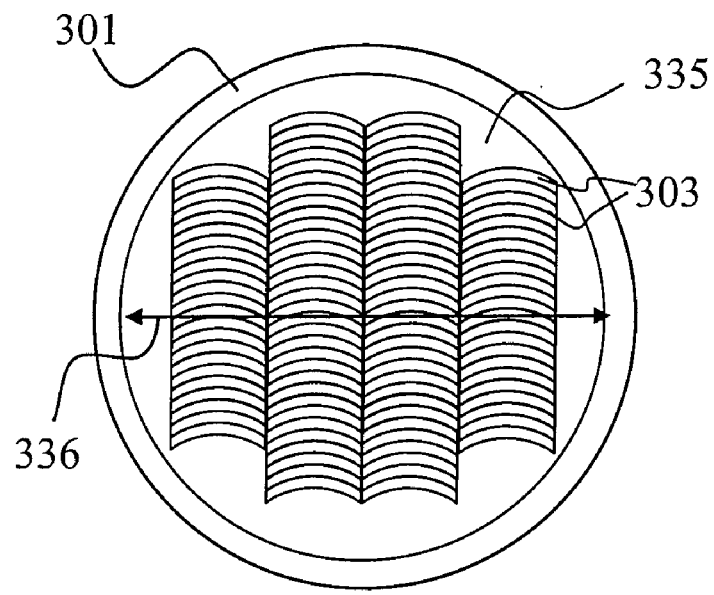
FIG. 3b shows a plan view of the first optical element.

FIG. 3b shows a plan view of the first optical element 301, which includes a plurality of first reflective facet elements 303.

Figure 3C:
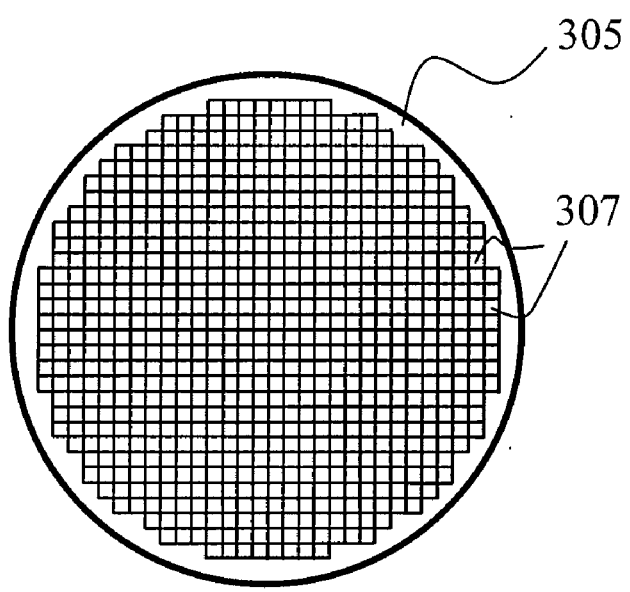
FIG. 3c shows a plan view of the second optical element.

FIG. 3c shows a corresponding plan view of the second optical element 305 including a plurality of second reflective facet elements 307. In this case, the number of first reflective facet elements 303 is less than the number of second reflective facet elements 307.

The microlithography projection exposure apparatus according to FIG. 3a furthermore includes a light source unit 363, which directs radiation onto the first optical element 301. In this case, the light source unit 363 includes a source plasma 365 and a collector mirror 367. The light source unit 363 can be embodied in various embodiments. It can be a laser plasma source (LPP), in which a narrowly delimited source plasma 365 is generated by a small material droplet being irradiated with a high-energy laser. As an alternative, a discharge source can be involved, in which the source plasma 365 is generated with the aid of a discharge. In both cases, a luminous source plasma 365 occurs which emits radiation in particular in the wavelength range of 5 nm-15 nm. The radiation is collected with the aid of the collector mirror 367 and directed onto the first optical element 301. A substantially circular illuminated region 335 having a diameter D (336) arises on the first optical element, wherein the first reflective facet elements 303 are arranged within the illuminated region 335. The diameter D (336) results from the aperture of the radiation downstream of the light source unit 363, the optically used diameter of the collector mirror 367 and the distance between the light source unit 363 and the first optical element. The collector mirror 367 and the first reflective facet elements 303 have an optical effect such that images of the source plasma 365 arise at the locations of the second reflective facet elements 307 of the second optical element 305. For this purpose, firstly the focal lengths of the collector mirror 367 and of the first facet elements 303 are chosen in accordance with the spatial distances. This is done e.g. by the reflective optical surfaces of the first reflective facet elements 303 being provided with suitable curvatures. Secondly, the first reflective facet elements 303 have a reflective optical surface with a normal vector whose direction defines the orientation of the reflective optical surface spatially, wherein the normal vectors of the reflective optical surfaces of the first facet elements 303 are oriented in such a way that the radiation reflected from a first facet element 303 impinges on an assigned second reflective facet element 307. In this case the first reflective facet elements are embodied in such a way that they have a maximum number of positions, wherein the positions differ in the orientation of the normal vector. Consequently, each first facet element 303 has a number of positions, wherein it directs radiation onto one assigned second reflective facet element 307 in the first position and directs radiation onto another assigned second reflective facet element in a second position. FIG. 5 shows an exemplary embodiment of a first reflective facet element of this type. In one specific configuration, some or all of the first reflective facet elements 303 have a position in which they direct radiation onto the diaphragm 368. This increases the variability of the illumination optical unit since the number of second reflective facet elements 307 onto which radiation is directed can be reduced.

The choice of the second reflective facet elements onto which radiation is directed is of particular importance since the second optical element 305 is arranged in a pupil plane of the illumination optical unit 339, which is imaged onto the exit pupil plane with the aid of the mirrors 341, 343 and 345. In this case, the exit pupil plane of the illumination optical unit precisely corresponds to the entrance pupil plane 352 of the projection optical unit. Consequently, the second optical element 305 likewise lies in a plane that is optically conjugate with respect to the entrance pupil plane 352 of the projection optical unit 351. In this case, the entrance pupil plane of the projection optical unit is defined as the plane perpendicular to the optical axis 361 in which the principal ray 362 intersects the optical axis at the midpoint of the object field 347. For this reason, the intensity distribution of the radiation on the second optical element 305 is in a simple relationship with the angle-dependent intensity distribution of the radiation in the region of the object field 347 and leads to significant influences on the quality of the imaging by the projection optical unit 351. Therefore, the positions of the first reflective facet elements 303, that is to say the orientations of the reflective optical surfaces of the first facet elements 303, are set in such a way as to result in a desired intensity distribution on the second optical element 307 and hence a desired angle-dependent intensity distribution at the location of the object field 347. Depending on the structure-bearing mask, different angle-dependent intensity distributions are involved in order to allow a particularly good imaging by the projection optical unit 351. According to the disclosure, a large number of desired different angle-dependent intensity distributions are provided at the location of the object field 347.

The task of the second facet elements 307 and of the downstream optics including the mirrors 341, 343 and 345 is to image the first facet elements 303 in a superimposing fashion onto the object field 347 in the object plane 349. In this case, superimposing imaging is understood to mean that images of the first reflective facet elements 303 arise in the object plane and at least partly overlap there. For this purpose, the second reflective facet elements 307 have a reflective optical surface with a normal vector whose direction defines the orientation of the reflective optical surface spatially. In this case, for each second facet element 307, the direction of the normal vector is chosen such that the first facet element 303 assigned to it is imaged onto the object field 347 in the object plane 349.

Since the first facet elements 303 are imaged onto the object field 347, the form of the illuminated object field 347 corresponds to the outer form of the first facet elements 303. The outer form of the first facet elements 303 is therefore usually chosen to be arcuate in such a way that the long boundary lines of the illuminated object field 347 run substantially in circle arc form about the optical axis 361 of the projection optical unit 358.

Figure 4:
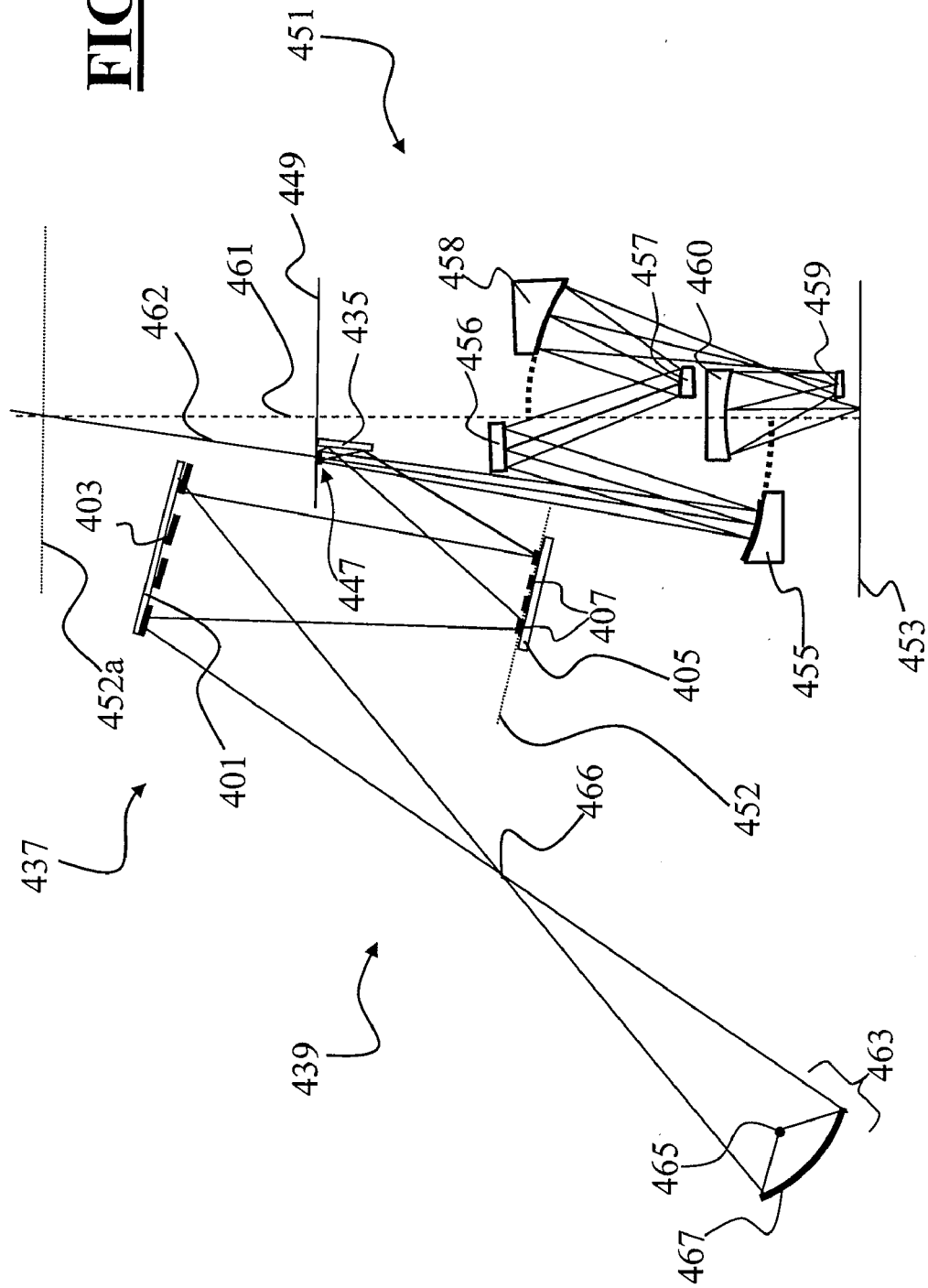
FIG. 4 shows a projection exposure apparatus according to the disclosure including an alternative illumination optical unit.

FIG. 4 shows a further configuration of the illumination optical unit according to the disclosure in a microlithography projection exposure apparatus. In this case, the projection exposure apparatus 437 includes the illumination optical unit 439 and the projection optical unit 451. In contrast to the projection optical unit 351 illustrated in FIG. 3a, the projection optical unit 451 according to FIG. 4 has a negative vertex focal length of the entrance pupil. That is to say that the entrance pupil plane 452 of the projection optical unit 451 is arranged in the light path upstream of the object field 447. If the principal ray 462 is extended further, without taking account of the reflection at the structure-bearing mask at the location of the object field 447, then the principal ray intersects the optical axis 461 in the plane 452a. If the reflections at the structure-bearing mask at the location of the object field 447 and at the deflection mirror 447 are taken into account, then the plane 452a coincides with the entrance pupil plane 452. In the case of such projection optical units having a negative vertex focal length of the entrance pupil, the principal rays have a divergent ray course in the light direction at different object field points at the location of the object field 447. Projection optical units of this type are known from US2009/0079952A1. A further difference with respect to the illumination optical unit according to FIG. 3a is that the source plasma 465 is firstly imaged onto an intermediate focus 466 with the aid of the collector mirror 467. The intermediate focus 466 is then imaged onto the second reflective facet elements 407 of the second optical element 405 with the aid of the first reflective facet elements 403 of the first optical element 401.

Figure 5A:
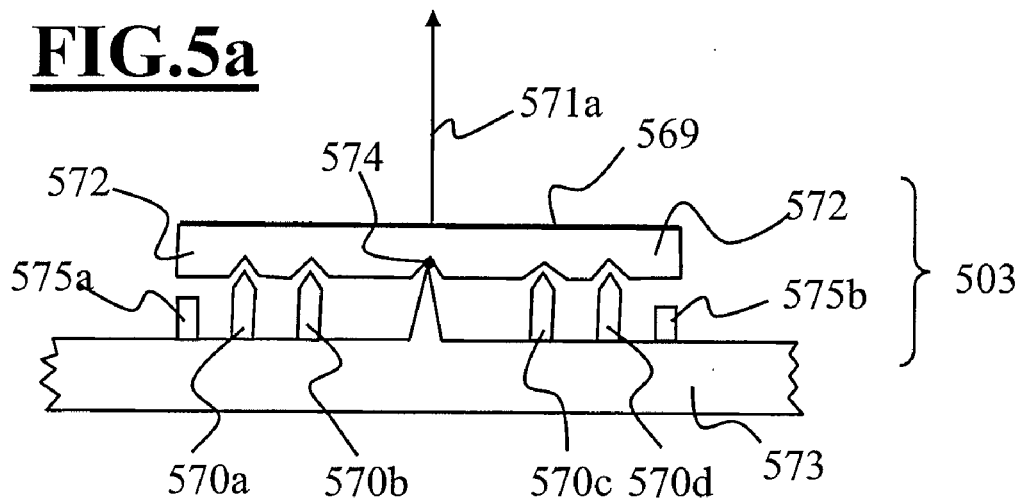
FIGS. 5a, 5b and 5c show the construction and the functioning of a first reflective facet element having a maximum number of positions.
Figure 5B:
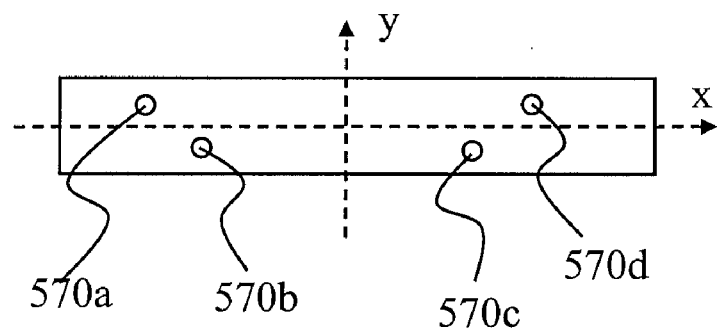
Figure 5C:
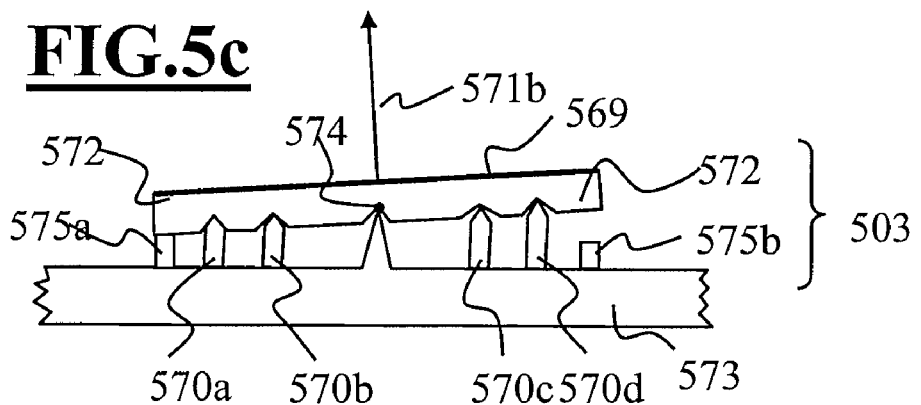

FIG. 5a schematically shows a mechanical embodiment of a first reflective facet element 503. In this case, the first reflective facet element 503 has a reflective optical surface 569 with a normal vector 571a, which is perpendicular to the optical surface 569 at the midpoint. The direction of the normal vector 571a thus indicates the orientation of the reflective optical surface 569 spatially. In addition, the first reflective optical element 503 has four actuators 570, by which the orientation of the reflective optical surface 569 is altered. FIG. 5b illustrates a plan view of the first reflective optical element according to FIG. 5a. A system of Cartesian coordinates with an x-axis and a y-axis is additionally shown. Since the actuators 570 are at a distance from one another both in the x-direction and in the y-direction, the actuators 570 make it possible to rotate the reflective optical surface 569 both about the x-axis and about the y-axis. FIG. 5c shows the first reflective optical element 503 in a second position, in which the reflective optical surface 569 has a different orientation, in contrast to the position shown in FIG. 5a. The normal vectors 571a and 571b thus form an angle different from 0°. The mirror substrate 572 has been rotated about the pivot 574. This was achieved by virtue of the actuators 570a, 570b, 570c and 570d, in the position according to FIG. 5c, having different extents perpendicular to the mirror carrier 573. In the position according to FIG. 5c, the substrate 572 is additionally in mechanical contact with the end stop 575a. The end stop 575a limits a further rotation about the pivot 574 in the counterclockwise direction. Accordingly, a position of the first reflective optical element 503 is defined very precisely by the exact mechanical embodiment of the end stop 575a. The end stop 575b corresponding defines a second position of the first reflective optical element 503. In this specific configuration, the first reflective optical element 503 has two positions which can be set very precisely and which differ in the orientation of the reflective optical surface 569. Other mechanical configurations providing more than two precisely settable settings of the first reflective optical element 503 are likewise possible.

Figure 6B:
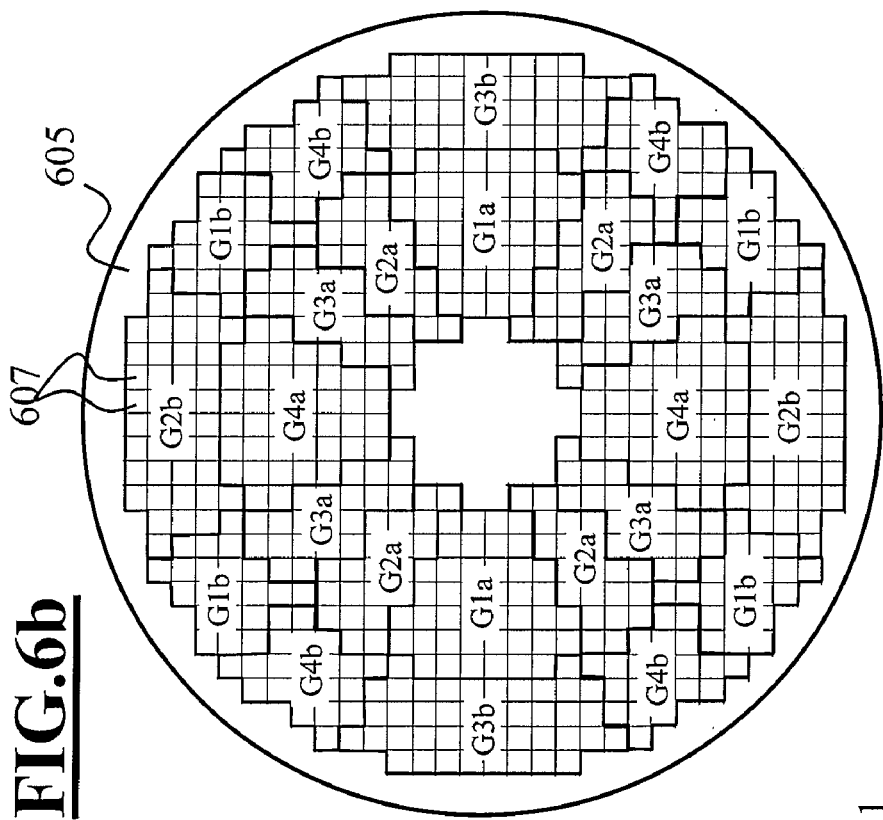
Figure 6A:
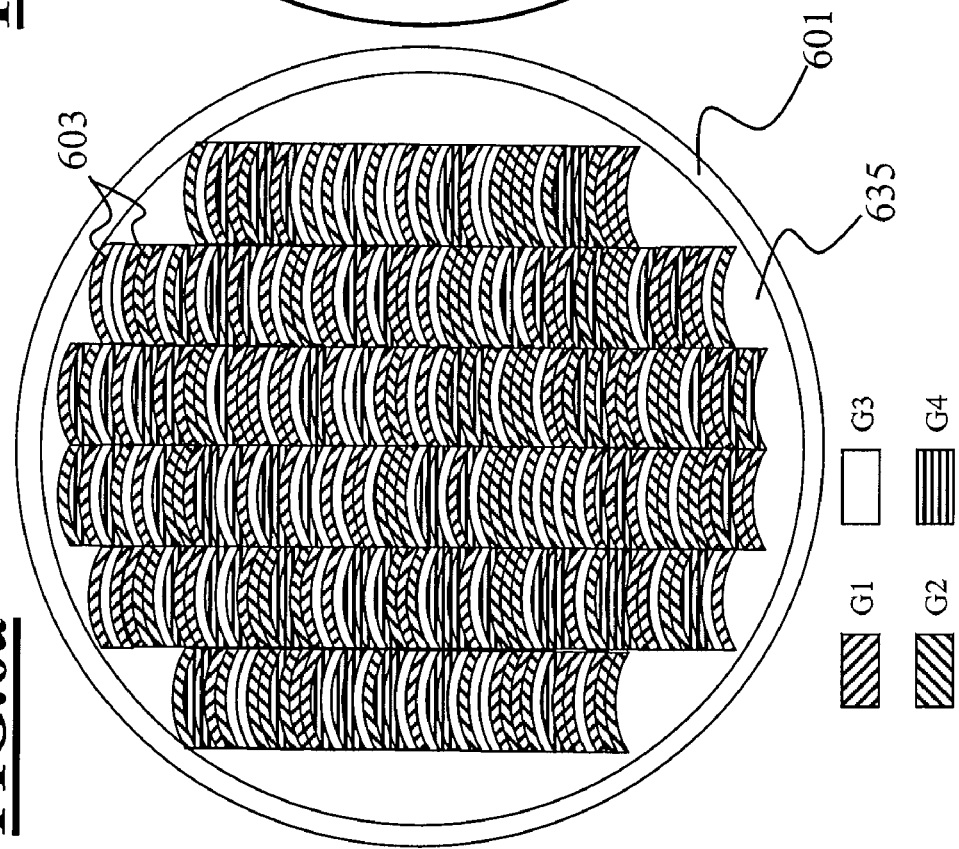
FIG. 6a shows a plan view of the first optical element in one configuration of the illumination optical unit according to the disclosure.

FIG. 6a shows a first configuration of a first optical element 601 including first reflective facet elements 603 having an arcuate form. In this case, the first reflective facet elements 603 form four assigned groups, which are identified by different hatchings for the sake of better clarity. In this case, the first optical element 601 includes 336 first reflective facet elements 603, wherein each of the groups G1, G2, G3, G4 respectively contains 84 first reflective facet elements 3. In this case, all first reflective facet elements 603 have at least two positions such that they direct radiation onto different second reflective facet elements depending on the position during the operation of the illumination optical unit. FIG. 6b shows the associated second optical element 605 including second reflective facet elements 607. Since the first reflective optical element 601 contains 336 first reflective facet elements 3 each having two positions, the second optical element 605 includes a total of 2×336=672 second reflective facet elements 607. In this case, the second reflective facet elements 607 form eight groups, the groups G1a, G1b, G2a, G2b, G3a, G3b, G4a and G4b. In this case, the groups of second reflective facet elements 607 having the same sequential number are mutually inverse and have the same assigned group of first reflective facet elements. Thus, e.g. the groups G1a and G1b are mutually inverse, such that radiation cannot be directed simultaneously onto all second reflective facet elements 607 of the group G1a and one of the second reflective facet elements from group G1b. The group G1 consisting of first reflective facet elements 603 belongs both to the group G1a and to the group G1b. Consequently, there is a first state, in which the first reflective facet elements of the group G1 direct radiation onto all second reflective facet elements of the group G1a, and a second state, in which the first reflective facet elements of the group G1 direct radiation onto all second reflective facet elements of the group G1b. This also has the consequence that the groups G1a and G1b contain the same number of second reflective facet elements. The analogous relationship correspondingly applies to the other groups. All groups having the same sequential number thus form a collection of inverse groups. Illustration of the sets has been omitted in this figure and further following figures. The set classification is obtained in these cases by progressively selecting a second reflective facet element for each collection from each group of a collection of inverse groups (e.g. G1a and G1b) and combining these selected second reflective facet elements to form a set. This selection is then repeated a number of times, but each second reflective facet element of the groups of the collection is selected only once, such that the number of sets thus constructed is equal to the number of second reflective facet elements in each of the groups of the collection. If the groups of a collection do not include the same number of second reflective facet elements, then the number of sets is equal to the number of second reflective facet elements in the largest group of a collection. In the present example, the inverse groups G1a and G1b each include 84 second reflective facet elements. Accordingly, 84 sets can be formed, each of the sets containing a second reflective facet element from the group G1a and a second reflective facet element from the group G1b. A set classification can thus be constructed from the indication of the collections of inverse groups. For this reason, the exact specification of the sets can be dispensed with in this example and the following examples. Instead, only the collections of inverse groups are presented.

Figure 7A:
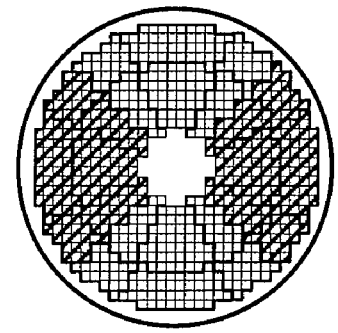
FIGS. 7a to 7h show some patterns of illuminated second reflective facet elements which can be set via the illumination optical unit according to FIGS. 6a and 6b.
Figure 7B:
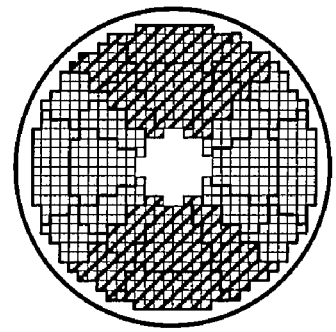
Figure 7C:
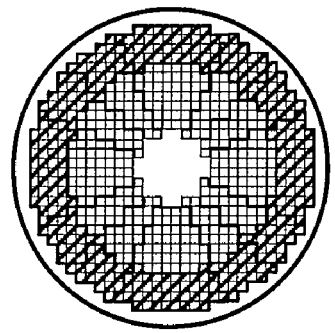
Figure 7D:
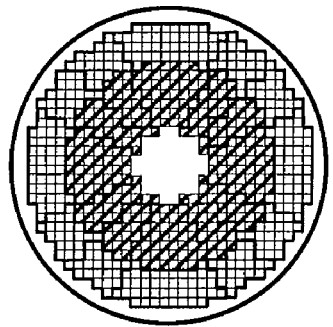
Figure 7E:
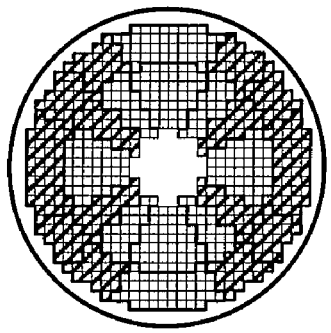
Figure 7F:
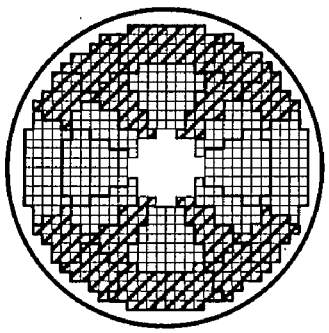
Figure 7G:
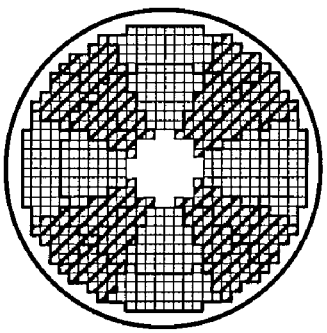
Figure 7H:
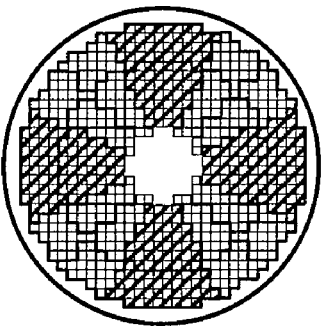

In this embodiment, the groups of second reflective facet elements 607 are chosen such that specific patterns of illuminated second reflective facet elements 607 can be established. A second reflective facet element 607 is referred to as illuminated when there is a first reflective facet element that directs radiation onto the corresponding second reflective facet element 607 during the operation of the illumination optical unit. FIGS. 7a to 7h show some patterns of illuminated second reflective facet elements 707 which are produced with the illumination optical unit according to the disclosure by virtue of the first optical element assuming a suitable state. Thus, FIG. 7a shows a pattern of illuminated second reflective facet elements (illustrated in a hatched fashion), which has the form of an annulus. In this case, all second reflective facet elements from the groups G1a, G2a, G1a and G4a are illuminated. FIG. 7b shows a pattern that arises if the respective inverse groups of second reflective facet elements are illuminated. This likewise results in the form of an annulus, but with a different radius and a different width of the annulus. FIGS. 7c and 7d show two illumination patterns each having the form of a dipole, although the main dipole axes differ by 90°. FIGS. 7e and 7f show two quadrupole-type illumination patterns. FIGS. 7g and 7h show two further illumination patterns, which are dipole-type.

Figure 8:
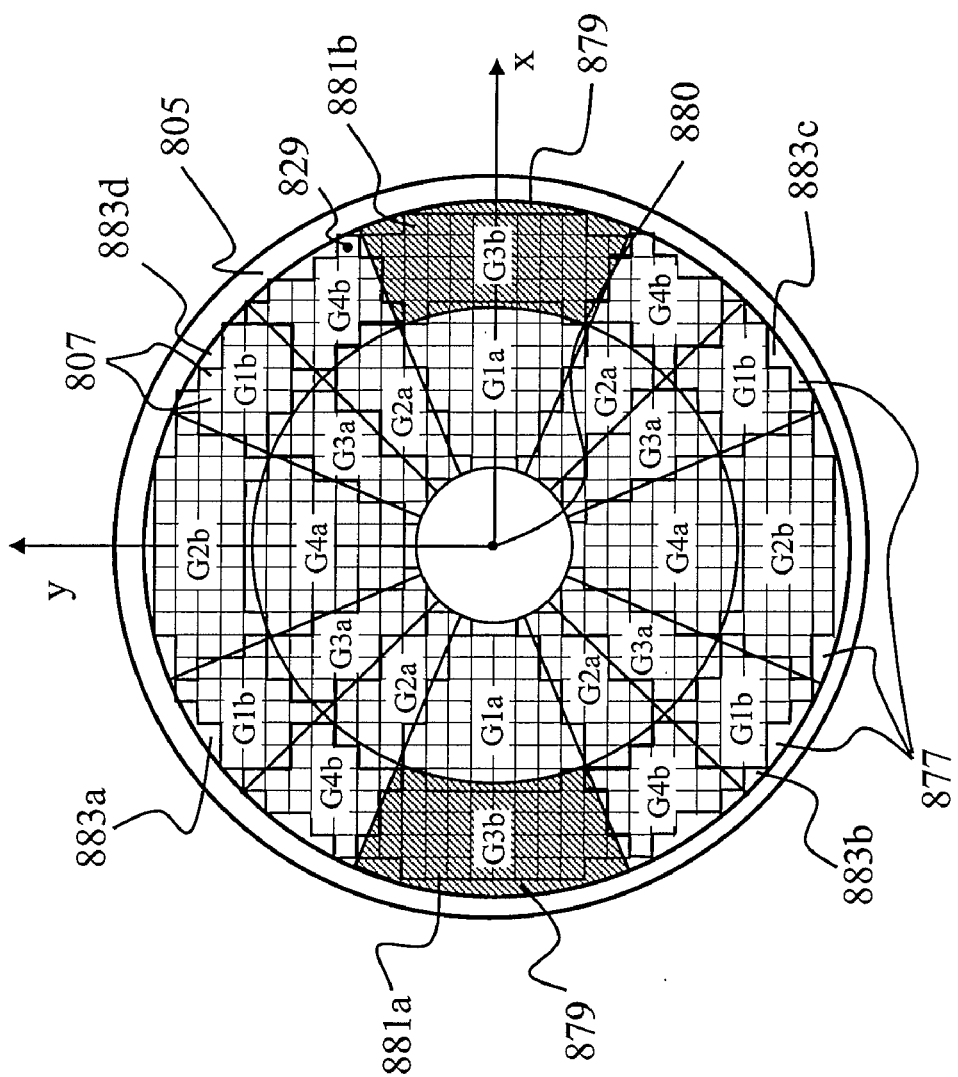
FIG. 8 shows the second optical element from FIG. 6b together with the group-associated regions.

FIG. 8 shows a further illustration of the second optical element 805 in the embodiment according to FIG. 6b. The group-associated regions 877 are additionally illustrated in FIG. 8. Since the second optical element either is situated in an exit pupil plane of the illumination optical unit or is imaged into such a plane, the group-associated regions 877 and the second optical element 805 can be illustrated in the same plane of the drawing. Accordingly, FIG. 8 should be understood such that, in the first embodiment, in which the second optical element 805 is arranged in an exit pupil plane of the illumination optical unit, the group-associated regions 877 and the second optical element 805 are actually arranged in one plane and, in the second embodiment, the group-associated regions 877 and the second optical element 805 lie in optically conjugate planes, but are illustrated in a superimposed fashion in the figure. For the sake of better illustration, the further description is restricted exclusively to the first case, in which the two planes coincide. However, all embodiments can be applied to the second case. The group-associated regions 877 are chosen such that they are disjoint with respect to one another, and that the midpoints 829 of the reflective optical surfaces of all second reflective facet elements of the corresponding group lie in the group-associated region (or are imaged into this region in the second case). The group-associated region 879 with respect to the group G3b is illustrated in a hatched fashion in FIG. 8. The region 879 is subdivided into the two non-contiguous partial regions 881a and 881b, the two partial regions 881a, 881b being situated centrosymmetrically with respect to the point of symmetry 880. The group-associated region with respect to the group G1b, for example, is correspondingly subdivided into four non-contiguous partial regions, which are likewise situated centrosymmetrically with respect to the point of symmetry 880. What is achieved as a result is that, in all states in which radiation is directed onto all second reflective facet elements 807 of a group, a centrosymmetric illumination arises in the exit pupil plane. The union of all group-associated regions has the form of a complete annulus. In addition, the groups of the second reflective facet elements can then be classified in classes. Eight selected classes are explained below. FIGS. 7a to 7h illustrate which patterns of illuminated second reflective facet elements arise if all second facet elements from groups of the same class are illuminated. A first class (FIG. 7a) is formed by the groups G1a, G2a, G3a and G4a. The union of the regions associated with these groups has the form of a first annulus. A second class (FIG. 7b) is formed by the groups G1b, G2b, G3b and G4b. The union of the regions associated with these groups has the form of a second annulus, which has a larger radius than the first annulus and a smaller width. A third class (FIG. 7c) is formed by the groups G1a, G2a, G3b and G4b. The union of the regions associated with these groups has the form of a dipole, the main axis of the dipole being oriented in the x-direction in the system of coordinates illustrated. A dipole is understood to be a form consisting of exactly two non-contiguous regions, the connecting line of the midpoints of the two regions defining the main dipole axis. In this case, the two non-contiguous regions are centrosymmetric with respect to one another with a point of symmetry lying on the main dipole axis. A fourth class (FIG. 7d) is formed by the groups G1b, G2b, G3a and G4a. The union of the regions associated with these groups has the form of a dipole, the main axis of the dipole being oriented in the y-direction in the system of coordinates illustrated. A fifth class (FIG. 7e) is formed by the groups G1a, G2b, G3b and G4a. The union of the regions associated with these groups has the form of a quadrupole. A quadrupole is understood to be a form composed of two disjoint dipoles, the points of symmetry of the two dipoles coinciding.

In this case, the main dipole axes each define a main axis of the quadrupole. The union of the regions associated with the groups of the fifth class has the form of a quadrupole, the two main axes being oriented in the x-direction and in the y-direction. A sixth class (FIG. 7f) is formed by the groups G1b, G2a, G3a and G4b. The union of the regions associated with these groups has the form of a quadrupole, the main axes being oriented at 45° with respect to the x-direction and with respect to the y-direction. A seventh class (FIG. 7g) is formed by the groups G1b, G2a, G3b and G4b. The union of the regions associated with these groups has the form of a dipole, the main axis of the dipole being oriented in the x-direction in the system of coordinates illustrated. An eighth class (FIG. 7h) is formed by the groups G1b, G2b, G3a and G4b. The union of the regions associated with these groups has the form of a dipole, the main axis of the dipole being oriented in the y-direction in the system of coordinates illustrated.

In order that radiation can be directed onto all second reflective facet elements 807 of one of the classes, there are no two groups of a class which are mutually inverse. To put it another way, there are no two second facet elements 807 from the same class which belong to the same set.

It is furthermore evident from FIG. 8 that the assigned region 879 for the group G3b has the same area content as the assigned regions for the groups G1b, G2b and G4b. Correspondingly, the area contents of the group-associated regions with respect to the groups G1a, G2a, G3a and G4a are likewise identical. The area contents of the regions with respect to the two groups G1a and G1b are identical to one another in so far as is permitted by the regular grid of the second reflective facet elements 807. The group G1a and the group G1b contain the same number of second reflective facet elements 807. Since the second reflective facet elements 807 all have the same size and are arranged in the form of a regular grid, it follows from this that the area occupied by the second reflective facet elements of the group G1a on the second optical element 805 is of just the same size as the area occupied by second reflective facet elements of the group G1b on the second optical element. This relation is not applied exactly to the area contents of the group-associated regions, since the boundary lines between the regions do not all run along the grid. However, the deviation becomes all the smaller, the finer the grid, that is to say the greater the number of second reflective facet elements used.

A further property of the second reflective facet elements 807, which results from the group classification, likewise becomes clear with reference to FIG. 8. The associated region for the group G1b is subdivided into the disjoint partial regions 883a, 883b, 883c and 883d. In order that radiation is directed into each of these partial regions, at least one second reflective facet element 807 whose midpoint of the reflective optical surface lies within these partial regions or is imaged into the latter. Accordingly, the group G1b contains at least four second reflective facet elements 807. The same correspondingly applies to the groups G2a, G3a and G4b. In the present case, inverse groups have the same number of second reflective facet elements 807, such that the inverse groups G1a, G2b, G3b and G4a likewise each include four second reflective facet elements. The second optical element thus has at least 32 second reflective facet elements. In order that this uniform distribution of the second reflective facet elements 807 over the groups is fulfilled even in the case of larger numbers of second reflective facet elements 807, an integral multiple of 32 is chosen as the total number of second reflective facet elements. In the configuration according to FIG. 6b (or FIG. 8), the second optical element 605 includes a total of 21×32=672 second reflective facet elements. In the case of some other finer group classification, corresponding other relations arise. This restriction for the total number of second reflective facet elements 806 leads to a corresponding relation for the total number of first reflective facet elements. This has the effect that the number of first reflective facet elements is an integral multiple of 16. In the described embodiment according to FIG. 6a, the first optical element has 21×16=336 first reflective facet elements.

Figure 9A:
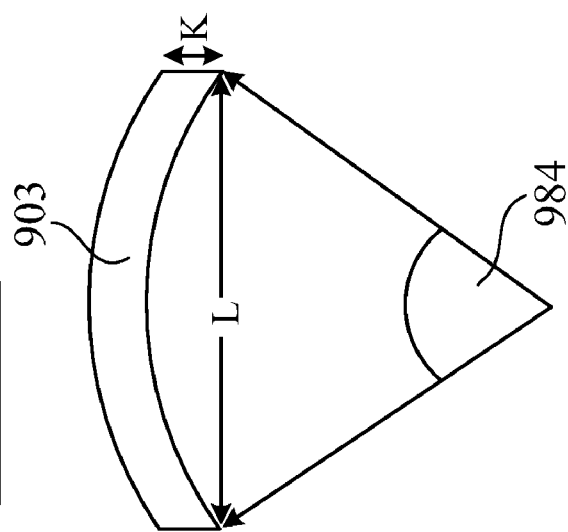
FIG. 9a shows a plan view of one of the first reflective facet elements in a detail illustration.
Figure 9B:
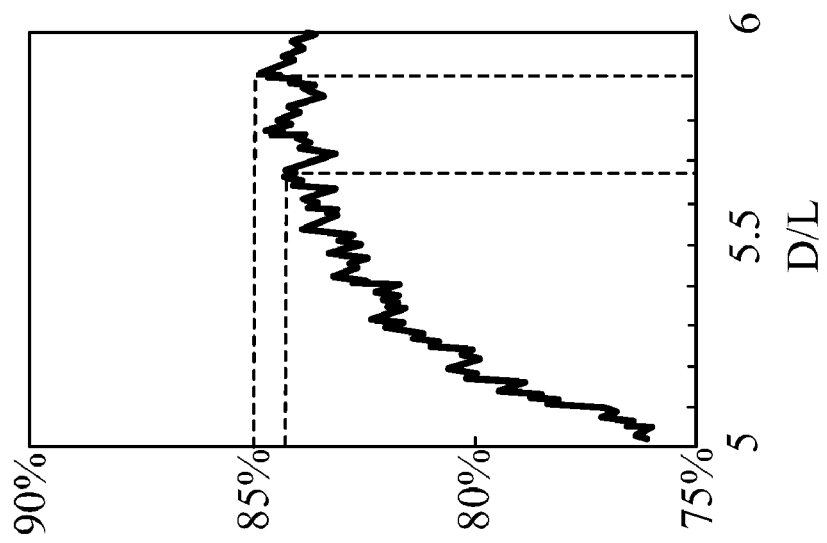
FIG. 9b shows the number of first reflective facet elements as a function of the dimensions of the first reflective facet elements and of the first optical element.
Figure 9C:
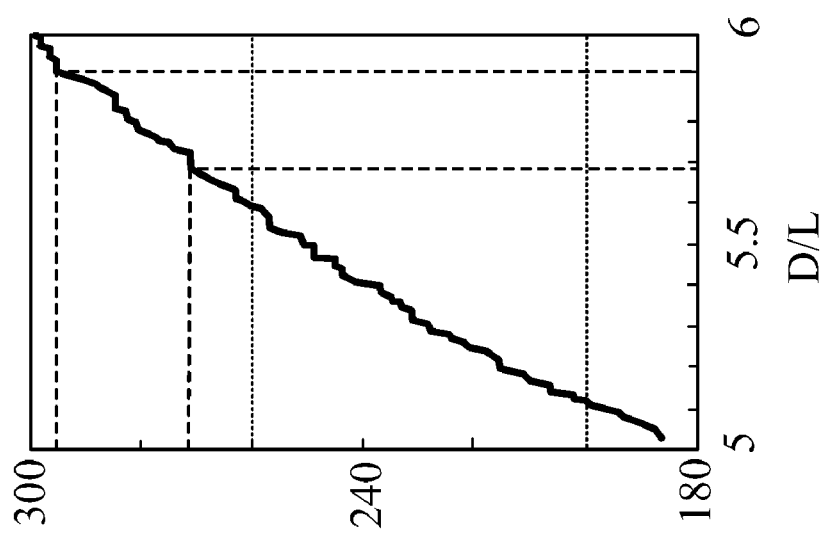
FIG. 9c shows the degree of filling of the first optical element as a function of the dimensions of the first reflective facet elements and of the first optical element.

A further boundary condition with regard to the number of first and second reflective facet elements results from the exact form of the first facet elements. It was explained with regard to FIG. 3b that the first reflective facet elements 303 are arranged within the illuminated region 335. In this case, it is advantageous, however, if a greatest possible proportion of the illuminated region 335 is covered with first reflective facet elements, since as little radiation from the light source unit as possible is lost in this way. The number of first reflective facet elements which can be arranged in the illuminated region is related to the exact form of the first reflective facet elements and the diameter D (336) of the illuminated region. FIGS. 9a, 9b and 9c show an example of this boundary condition. FIG. 9a illustrates a first reflective facet element 903. The first reflective facet element has an arcuate form, the arc having an arc angle 984 of 46°. The facet element has a length L in the long extent and a width K in the short extent. The aspect ratio of L to K is 30:1. Aspect ratios 20:1 to 40:1 are likewise possible. Given a fixed aspect ratio and a fixed arc angle 984, the first reflective facet element scales with the length L. The number of first reflective facet elements 903 which can be arranged within the illuminated region 335 in FIG. 3b is therefore only dependent on the ratio of the diameter D to the length L. FIG. 9b shows how many first reflective facet elements can be arranged within the illuminated region, as a function of the ratio of D to L. At the same time, the degree of filling, which is defined as that proportion of the illuminated area which is occupied by first reflective facet elements, is also dependent on the ratio of D to L. FIG. 9c shows this functional relationship. Consequently, in the selection of the ratio D/L, care should be taken to ensure both that the degree of filling is relatively high, and that a number of first reflective facet elements which is an integral multiple of 16 arises. FIG. 9c shows that the maximum degree of filling results for D/L=5.91. FIG. 9b reveals, however, that the total number of first reflective facet elements for D/L=5.91 is equal to 295 and hence not divisible by 16 without a remainder. For D/L=5.57, by contrast, although only a degree of filling of 84.3% arises, in return a total number of first reflective facet elements equal to 17×16=272 arises.

Figure 10:
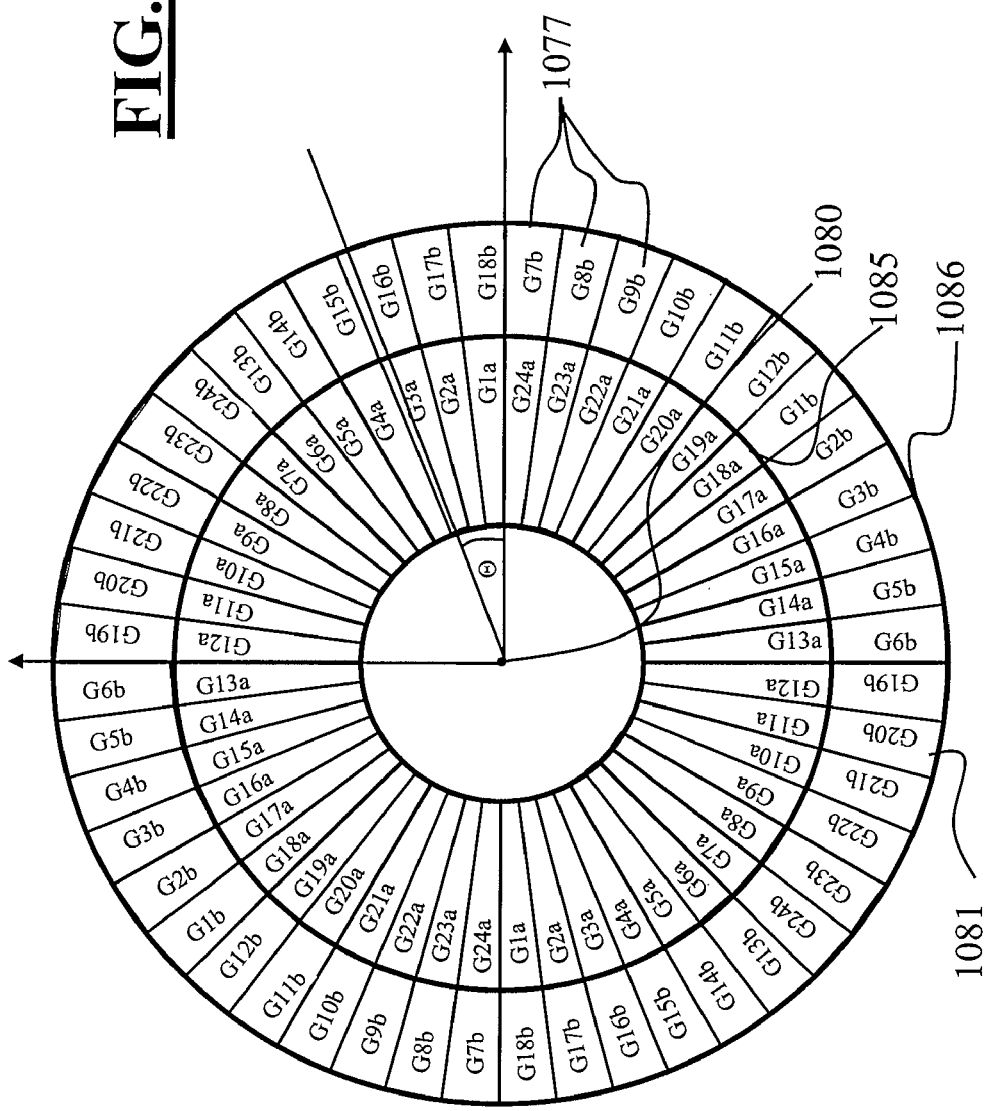
FIG. 10 shows the group-associated regions in the exit pupil plane which arise in a further configuration of the disclosure.

FIG. 10 shows the group-associated regions 1077 in the exit pupil plane which arise in the case of a further configuration of the disclosure. The illustration furthermore shows a system of polar coordinates, the midpoint of which coincides with the point of symmetry 1080. The polar angle is designated by Θ. Illustration of the second reflective facet elements has been omitted in order to ensure the clarity of the figure. In order to determine the second reflective elements which belong to the groups illustrated, the second optical element according to FIG. 3c is imaged into the pupil plane, if it is not already arranged there anyway, and the regions in which the midpoints of the optical surfaces of the second reflective facet elements lie are determined. The assignment of the second reflective facet elements to the groups is thus naturally obtained from the classification of the exit pupil plane as illustrated in FIG. 10. The same correspondingly also applies to FIGS. 12a and 14. In this embodiment, there are a total of 48 groups (G1a, G1b, G24a, G24b). In accordance with the argumentation concerning FIG. 8, the number of second reflective facet elements is therefore an integral multiple of 96. Furthermore, there are collections of in each case two groups which are mutually inverse. These are the two groups G1a and G1b, for example. The number of first reflective facet elements is therefore an integral multiple of 48. The group-associated regions 1077 are subdivided into in each case two partial regions, which are situated centrosymmetrically with respect to the point of symmetry 1080. In this case, each of the partial regions has the form of an annulus segment. In the radial direction of the system of polar coordinates there is a classification into two annuli. A first annulus 1085, in which lie all group-associated regions whose designation ends with "a", and a second annulus 1086, in which lie all group-associated regions whose designation ends with "b". By contrast, a significantly finer subdivision is present in the direction of the azimuth angle Θ. In this direction, all partial regions 1081 have an extent of 7.5°. What is achieved as a result is that relatively uniform illumination patterns also arise in the exit pupil plane, such as are illustrated in FIGS. 11c and 11d. The further FIGS. 11a to 11n show a selection of further illumination patterns which arise on account of the group classification according to FIG. 10. The illuminated regions are illustrated uniformly in black fashion in FIGS. 11a to 11n. FIGS. 11a and 11b show the two possible annular illumination patterns. FIGS. 11c and 11d show the two above-mentioned relatively uniform illumination patterns, in which azimuthally adjacent regions are alternately illuminated or not illuminated. FIGS. 11e to 11h show different dipoles having different orientations of the main dipole axis. FIGS. 11i and 11j show two quadrupole-type illuminations, and FIGS. 11k to 11n show a plurality of further dipole-type illuminations. In order to make possible the illumination patterns from FIGS. 11a to 11n, the groups are chosen such that each of the illumination patterns (FIGS. 11a to 11n) defines a class of groups, wherein there are no two groups of a class which are mutually inverse. To put it another way, there are no two second facet elements from the same class which belong to the same set. An illumination pattern defines a class by virtue of the fact that all groups whose associated regions lie in the illuminated region belong to the class.

FIG. 12a shows a group classification in an illustration similar to FIG. 10. In this embodiment, there are 16 groups (G1a, G1b, ..., G8a, G8b), which respectively in pairs are mutually inverse. In accordance with the argumentation concerning FIG. 8, the number of second reflective facet elements is therefore an integral multiple of 32. The illuminations according to FIGS. 11a, 11b, 11e, 11f, 11g, 11h, 11i and 11j can be realized with such a group classification.

In this case, assigned regions of inverse groups are at a distance from one another in terms of azimuth angle which is less than or equal to 135°. In this case, the distance between two regions is defined as the maximum distance between two arbitrary points of the two regions. The regions G1a and G1b are at a distance from one another in terms of azimuth angle of exactly 135°. The maximum distance between inverse groups also gives rise to the maximum distance between two second reflective facet elements of the same set in the exit pupil plane. In this case, the distance between two reflective facet elements in the exit pupil plane is defined as the distance between the images of the midpoints of the optical surfaces in the exit pupil plane. This distance between two second reflective facet elements of the same set in the exit pupil plane, in terms of azimuth angle is likewise 135° or less.

FIG. 12b illustrates how the group classification according to FIG. 12a can be extended such that further annular illumination patterns can be produced alongside the two annular illumination patterns according to FIGS. 11a and 11b. For this purpose, the sets of second reflective facet elements are chosen such that for each pair of second reflective facet elements F1 and F2 having the following properties that
    a. the second reflective facet elements F1 and F2 belong to the same group,
    b. the midpoint of the reflective optical surface of the second reflective facet element F1 or the image of the midpoint of the reflective optical surface of the second reflective facet element F1 in the exit pupil plane is at a distance d1 from the point of symmetry,
    c. the midpoint of the reflective optical surface of the second reflective facet element F2 or the image of the midpoint of the reflective optical surface of the second reflective facet element F2 in the exit pupil plane is at a distance d2 from the point of symmetry,
    d. and the distance d2 is greater than the distance d1,
a pair of second reflective facet elements F3 and F4 is assigned having the properties that
    e. the second reflective facet elements F3 and F4 belong to the same group,
    f. the second reflective facet elements F1 and F3 belong to the same set,
    g. the second reflective facet elements F2 and F4 belong to the same set,
    h. the midpoint of the reflective optical surface of the second reflective facet element F3 or the image of the midpoint of the reflective optical surface of the second reflective facet element F3 in the exit pupil plane is at a distance d3 from the point of symmetry,
    i. the midpoint of the reflective optical surface of the second reflective facet element F4 or the image of the midpoint of the reflective optical surface of the second reflective facet element F4 in the exit pupil plane is at a distance d4 from the point of symmetry,
    j. and the distance d4 is greater than the distance d3.

In FIG. 12b this is carried out by way of example for two reflective facet elements from the group G1a. For the two second reflective facet elements F1 and F2 from the group G1a, the respective midpoints 1229a and 1229b are at the distance d1 and d2, respectively, from the point of symmetry 1280, where d2 is greater than d1. For this pair, there is a pair of second reflective facet elements F3 and F4 which belong to the same group, namely the group G1b, which is inverse with respect to the group G1a.

Figure 13B:
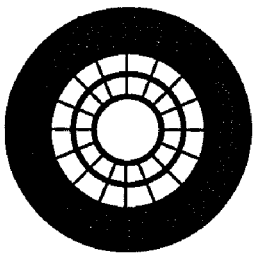
FIGS. 13a to 13c show a selection of illumination patterns which arise in the case of the improved group classification according to FIG. 12c.
Figure 13C:
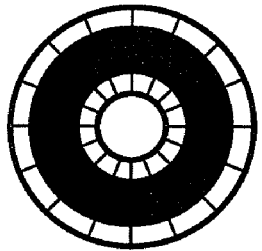
Figure 13A:
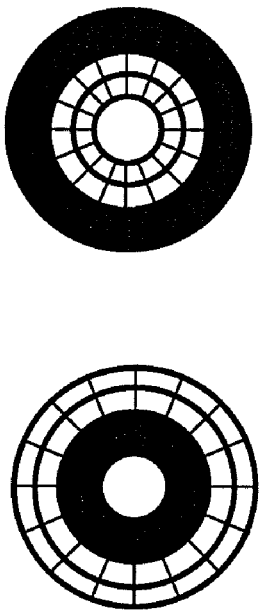

Furthermore, the midpoints 1229c and 1229d of the second reflective facet elements F3 and F4 are at the distances d3 and d4 from the point of symmetry 1280, where d4 is greater than d3. The sets are then chosen such that F1 and F3 belong to the same set and F2 and F4 belong to the same set. The sets are correspondingly chosen such that the relations are fulfilled for all groups. This automatically leads to the new, finer group classification illustrated in FIG. 12c. The group G1a becomes the two groups G1a' and G9a, the group G1a' lying closer to the point of symmetry. The situation is analogous for the other groups, thus resulting in the groups G1a', G1b', ..., G8a', G8b', G9a, G9b, ..., G16a, G16b. Depending on the number of second reflective facet elements per group, the groups can also be divided into more than two new groups. The annular illuminations illustrated in FIGS. 13a and 13b were able to be produced before the new group classification. On account of the new classification that is finer in the radial direction, the further annular illumination according to FIG. 13c can also be produced with the group classification according to FIG. 12c.

Figure 14:
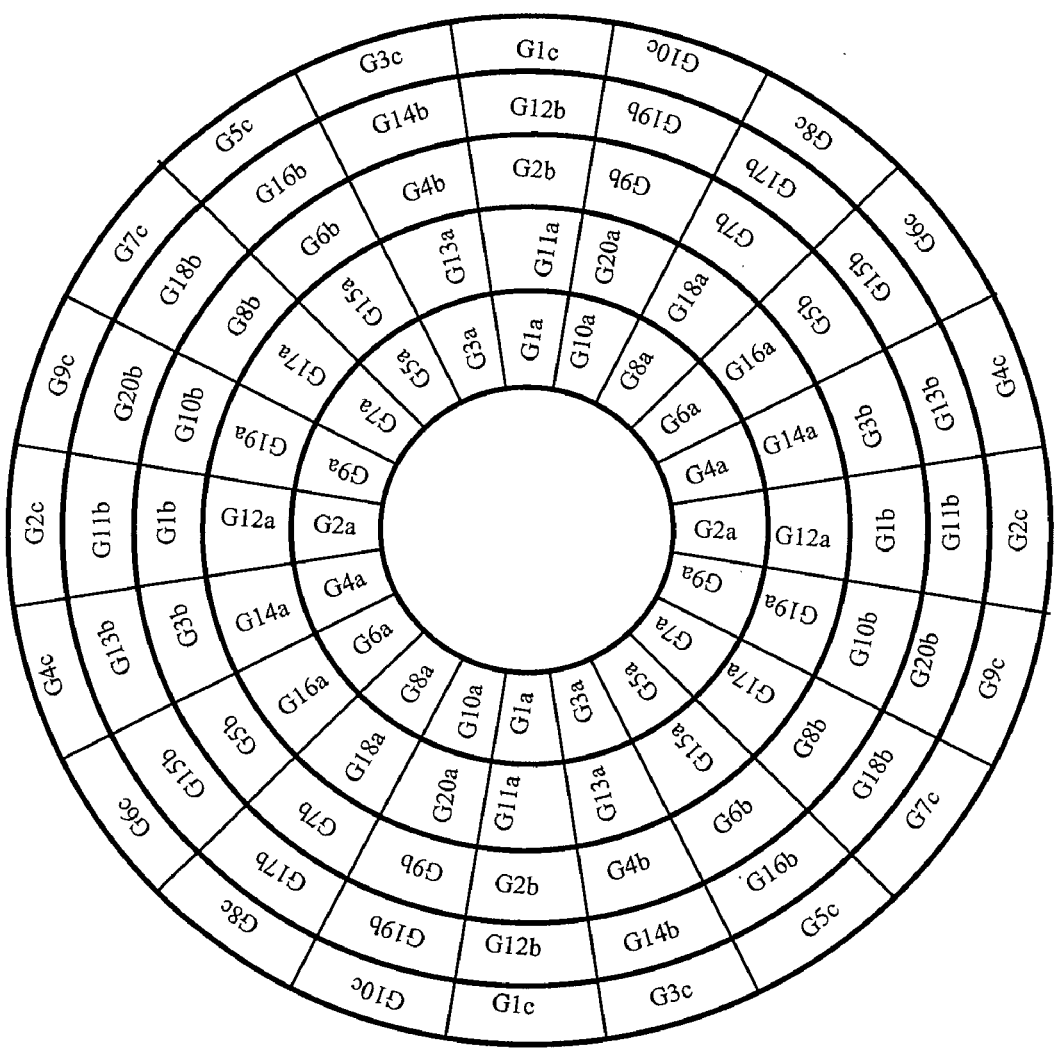
FIG. 14 shows the group-associated regions in the exit pupil plane which arise in a further configuration of the disclosure.

FIG. 14 shows a further embodiment of a group classification in an illustration similar to FIG. 10. In this embodiment, there are 50 groups. In accordance with the argumentation concerning FIG. 8, the number of second reflective facet elements is therefore an integral multiple of 100. Furthermore, there are ten collections (G1, ..., G10) composed of three groups which are mutually inverse. One collection is, for example, the groups G1a, G1b and G1c. Furthermore, there are ten collections (G11, ..., G20) composed of two groups which are mutually inverse. One example thereof is the collection G11a and G11b. Therefore, there is at least one set having exactly two second reflective facet elements, namely in each case one second reflective facet element from each group of a collection of two groups, and at least one set having more than two second reflective facet elements, namely in each case one second reflective facet element from each group of a collection of three groups. In this concrete case there are exactly 20 (or an integral multiple of 20) sets having exactly two second reflective facet elements and exactly 20 (or an integral multiple of 20) sets having exactly three reflective elements. Consequently, the boundary condition that the number of second reflective facet elements is an integral multiple of 100 is also met.

FIGS. 15a to 15n show a selection of illumination patterns which arise on account of the group classification according to FIG. 14. In this case, the illustration corresponds to FIGS. 11a to 11n. It is thus possible, with this group classification, to produce four differently annular illuminations, which are shown in FIGS. 15a to 15d. Furthermore, dipole-type illuminations can be realized with ten different orientations of the main dipole axis (FIGS. 15e to 15n).

What is claimed is:
1. An illumination optical unit, comprising:
a first optical element comprising a plurality of first reflective facet elements; and
a second optical element comprising a plurality of second reflective facet elements,
wherein:
    each first reflective facet element has a maximum number of different positions which defines a set that includes all of the second facet elements onto which the first facet element directs radiation in its different positions during the operation of the illumination optical unit;
    the plurality of second reflective facet elements forms a plurality of disjoint groups;
    each of the disjoint groups and each of the sets contain at least two second facet elements;
    there are no two second facet elements of a set which belong to the same disjoint group; and
    the illumination optical unit is configured to be used in EUV microlithography.

2. The illumination optical unit of claim 1, wherein:
there are first and second groups of second reflective facet elements such that for each second reflective facet element of the first group there is a second reflective facet element of the second group which belong to the same set; and
the first and second groups contain the same number of second reflective facet elements.

3. The illumination optical unit of claim 1 wherein:
each first reflective facet element has a reflective optical surface having a normal vector; and the positions of the first reflective facet elements differ in the orientation of the normal vector.

4. The illumination optical unit of claim 1, wherein, for each second reflective facet element, there is exactly one assigned first reflective facet element which has a position such that the associated first reflective facet element directs radiation onto the second reflective facet element in the position during the operation of the illumination optical unit.

5. The illumination optical unit of claim 4, wherein:
each group of second reflective facet elements defines an assigned group of first reflective facet elements that contains all first reflective facet elements which are assigned to the second reflective facet elements of the group of second reflective facet elements; and
all first reflective facet elements of the same assigned group are configured so that a change between two positions can only be effected jointly.

6. The illumination optical unit of claim 5, wherein the normal vectors of two first reflective facet elements of the same assigned group have different directions in at least one common position.

7. The illumination optical unit of claim 1, wherein all sets contain exactly two second reflective facet elements.

8. The illumination optical unit of claim 1, wherein there is at least one set having exactly two second reflective facet elements, and there is at least one set having more than two second reflective facet elements.

9. The illumination optical unit of claim 1, wherein:
each second reflective facet element has a reflective optical surface having a midpoint;
the second optical element is arranged in an exit pupil plane of the illumination optical unit or is imaged into an exit pupil plane of the illumination optical unit during use of the illumination optical unit;
the exit pupil plane is subdivided into disjoint regions such that for each group of second reflective facet elements there is an associated region of the exit pupil plane; and
the midpoints of the reflective optical surfaces of all second reflective facet elements of a given group lie in the associated region or are imaged into the associated region during use of the illumination optical unit.

10. The illumination optical unit of claim 9, wherein:
all associated regions are subdivided into at least two disjoint partial regions;
the disjoint partial regions are situated centrosymmetrically with respect to a point of symmetry; and
all associated regions have the same point of symmetry.

11. The illumination optical unit of claim 10, wherein for each pair of second reflective facet elements F1 and F2 having the following properties:
a. the second reflective facet elements F1 and F2 belong to the same group;
b. the midpoint of the reflective optical surface of the second reflective facet element F1 or the image of the midpoint of the reflective optical surface of the second reflective facet element F1 in the exit pupil plane is at a distance d1 from the point of symmetry;
c. the midpoint of the reflective optical surface of the second reflective facet element F2 or the image of the midpoint of the reflective optical surface of the second reflective facet element F2 in the exit pupil plane is at a distance d2 from the point of symmetry; and
d. and the distance d2 is greater than the distance d1, there is an assigned pair of second reflective facet elements F3 and F4 for which:

e. the second reflective facet elements F3 and F4 belong to the same group;
f. the second reflective facet elements F1 and F3 belong to the same set;
g. the second reflective facet elements F2 and F4 belong to the same set;
h. the midpoint of the reflective optical surface of the second reflective facet element F3 or the image of the midpoint of the reflective optical surface of the second reflective facet element F3 in the exit pupil plane is at a distance d3 from the point of symmetry;
i. the midpoint of the reflective optical surface of the second reflective facet element F4 or the image of the midpoint of the reflective optical surface of the second reflective facet element F4 in the exit pupil plane is at a distance d4 from the point of symmetry; and
j. and the distance d4 is greater than the distance d3.

12. The illumination optical unit of claim 11, wherein all disjoint partial regions are shaped as a segment of an annulus.

13. The illumination optical unit of claim 9, wherein the union of all associated regions has the shape of a complete circle or complete annulus.

14. The illumination optical unit of claim 9, wherein:
there is a plurality of groups of second facet elements forming a class;
the union of all associated regions which belong to the groups of the class has the form of a complete annulus; and
there are no two second facet elements from the same class which belong to the same set.

15. The illumination optical unit of claim 14, wherein:
the first optical element has a first state and a second state;
during use of the illumination optical unit, the first state leads to a different illumination in the exit pupil plane than does the second state;
radiation is applied to all second reflective facet elements of a first class in the first state during use of the illumination optical unit; and
radiation is applied to all second reflective facet elements of a second class in the second state during use of the illumination optical unit.

16. The illumination optical unit of claim 9, wherein:
there is a plurality of groups forming a class;
the union of all associated regions which belong to the groups of the class has the form of a dipole; and
there are no two second facet elements from the same class which belong to the same set.

17. The illumination optical unit of claim 9, wherein:
there is a plurality of groups forming a class;
the union of all group-associated regions which belong to the groups of the class has the form of a quadrupole; and
there are no two second facet elements from the same class which belong to the same set.

18. The illumination optical unit of claim 1, wherein the illumination optical unit comprises greater than 250 second reflective facet elements, and the illumination optical unit comprises less than 50 groups of second reflective facet elements.

19. An apparatus, comprising:
an illumination optical unit according to claim 1,
wherein the apparatus is a microlithography projection exposure apparatus.

20. The apparatus of claim 19, further comprising a projection optical unit.

* * * * *

UNITED STATES PATENT AND TRADEMARK OFFICE
CERTIFICATE OF CORRECTION

PATENT NO.         : 8,395,754 B2
APPLICATION NO.    : 12/949478
DATED              : March 12, 2013
INVENTOR(S)        : Martin Endres It is certified that error appears in the above-identified patent and that said Letters Patent is hereby corrected as shown below:

In the Specification

Column 15,
Line 1, delete "G1a" and insert --G3a--

Figure 12C:
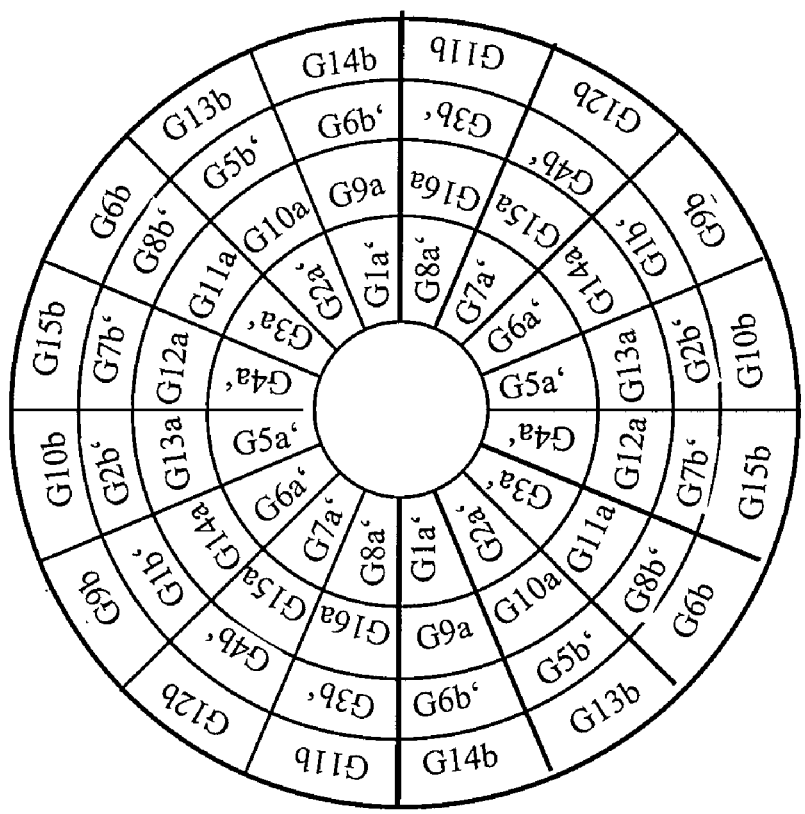
FIG. 12c shows the improved group classification in an illustration similar to FIG. 10.

Column 19-20,
Lines 54-4, delete "Furthermore,....FIG. 12c." and insert the same after "G1a." on Col. 19, Line 53 as continuation of the paragraph.

Signed and Sealed this
Eleventh Day of June, 2013

Teresa Stanek Rea
*Acting Director of the United States Patent and Trademark Office*